(12) United States Patent
Li et al.

(10) Patent No.: US 12,021,170 B2
(45) Date of Patent: Jun. 25, 2024

(54) LIGHT-EMITTING DEVICE, MANUFACTURING METHOD THEREFOR, AND DISPLAY DEVICE COMPRISING SAME

(71) Applicant: SAMSUNG DISPLAY CO., LTD., Yongin-si (KR)

(72) Inventors: Xinxing Li, Yongin-si (KR); Tae Jin Kong, Yongin-si (KR); Myeong Hee Kim, Yongin-si (KR); Je Won Yoo, Yongin-si (KR); Hyun Deok Im, Yongin-si (KR); Baek Hyeon Lim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 662 days.

(21) Appl. No.: 17/261,370

(22) PCT Filed: Jan. 18, 2019

(86) PCT No.: PCT/KR2019/000793
§ 371 (c)(1),
(2) Date: Jan. 19, 2021

(87) PCT Pub. No.: WO2020/017718
PCT Pub. Date: Jan. 23, 2020

(65) Prior Publication Data
US 2021/0288217 A1    Sep. 16, 2021

(30) Foreign Application Priority Data

Jul. 20, 2018  (KR) .......................... 10-2018-0084709

(51) Int. Cl.
*H01L 33/38* (2010.01)
*H01L 25/075* (2006.01)
(Continued)

(52) U.S. Cl.
CPC .......... *H01L 33/38* (2013.01); *H01L 25/0753* (2013.01); *H01L 33/20* (2013.01); *H01L 33/44* (2013.01); *H01L 2933/0016* (2013.01)

(58) Field of Classification Search
CPC ..... H01L 33/38; H01L 25/0753; H01L 33/20; H01L 33/44; H01L 2933/0016;
(Continued)

(56) References Cited

U.S. PATENT DOCUMENTS 8,872,214 B2   10/2014  Negishi et al.
9,059,114 B2   6/2015   Do et al.
(Continued)

FOREIGN PATENT DOCUMENTS

CN    107611153    1/2018
CN    108074961    5/2018
(Continued)

OTHER PUBLICATIONS

International Search Report, with English translation, corresponding to International Application No. PCT/KR2019/000793, dated May 3, 2019.
(Continued)

*Primary Examiner* — Jonathan Han
(74) *Attorney, Agent, or Firm* — KILE PARK REED & HOUTTEMAN PLLC

(57) ABSTRACT

A light emitting device may include: a substrate including emission areas; a first electrode disposed on the substrate, and a second electrode spaced apart from the first electrode; at least one light emitting element disposed on the substrate, and including a first end and a second end; an insulating layer disposed on the light emitting element and allowing the first and second ends of the light emitting element to be exposed; a first contact electrode electrically connecting the first electrode with the first end of the light emitting element;
(Continued)

a second contact electrode electrically connecting the second electrode with the second end of the light emitting element; and a passivation pattern disposed on each of the first and second contact electrodes. The first and second contact electrodes may be disposed on the insulating layer and spaced apart from each other and may be electrically separated from each other.

22 Claims, 23 Drawing Sheets

(51) Int. Cl.
  *H01L 33/20* (2010.01)
  *H01L 33/44* (2010.01)
(58) Field of Classification Search
  CPC ..... H01L 25/167; H01L 33/62; H01L 27/156; H01L 33/005; H01L 33/24; H10K 59/00; H10K 59/10
  See application file for complete search history.

(56) References Cited

U.S. PATENT DOCUMENTS

| | | |
|---|---|---|
| 9,229,236 B2 | 1/2016 | Hino et al. |
| 9,287,242 B2 | 3/2016 | Shibata et al. |
| 9,570,425 B2 | 2/2017 | Do |
| 9,773,761 B2 | 9/2017 | Do |
| 10,199,449 B2 | 2/2019 | Kim et al. |
| 10,461,123 B2 | 10/2019 | Kim et al. |
| 10,672,946 B2 | 6/2020 | Cho et al. |
| 2011/0089850 A1 | 4/2011 | Shibata et al. |
| 2013/0027623 A1 | 1/2013 | Negishi et al. |
| 2018/0019369 A1* | 1/2018 | Cho .................. H05K 1/11 |

FOREIGN PATENT DOCUMENTS

| | | | |
|---|---|---|---|
| JP | 4814394 | | 11/2011 |
| JP | 2012-4535 | | 1/2012 |
| JP | 4914929 | | 4/2012 |
| KR | 1020080059801 A | * | 12/2006 |
| KR | 10-2008-0059801 | | 7/2008 |
| KR | 10-2013-0080412 | | 7/2013 |
| KR | 10-2014-0085331 | | 7/2014 |
| KR | 10-1436123 | | 11/2014 |
| KR | 10-1490758 | | 2/2015 |
| KR | 10-2018-0007376 | | 1/2018 |
| KR | 10-2018-0072909 | | 7/2018 |
| KR | 10-2018-0077114 | | 7/2018 |

OTHER PUBLICATIONS

Written Opinion, with English translation, corresponding to International Application No. PCT/KR2019/000793, dated May 3, 2019.
Korean Notice of Allowance with English Translation for Korean Application No. 10-2018-0084709, dated Jul. 31, 2023.

\* cited by examiner

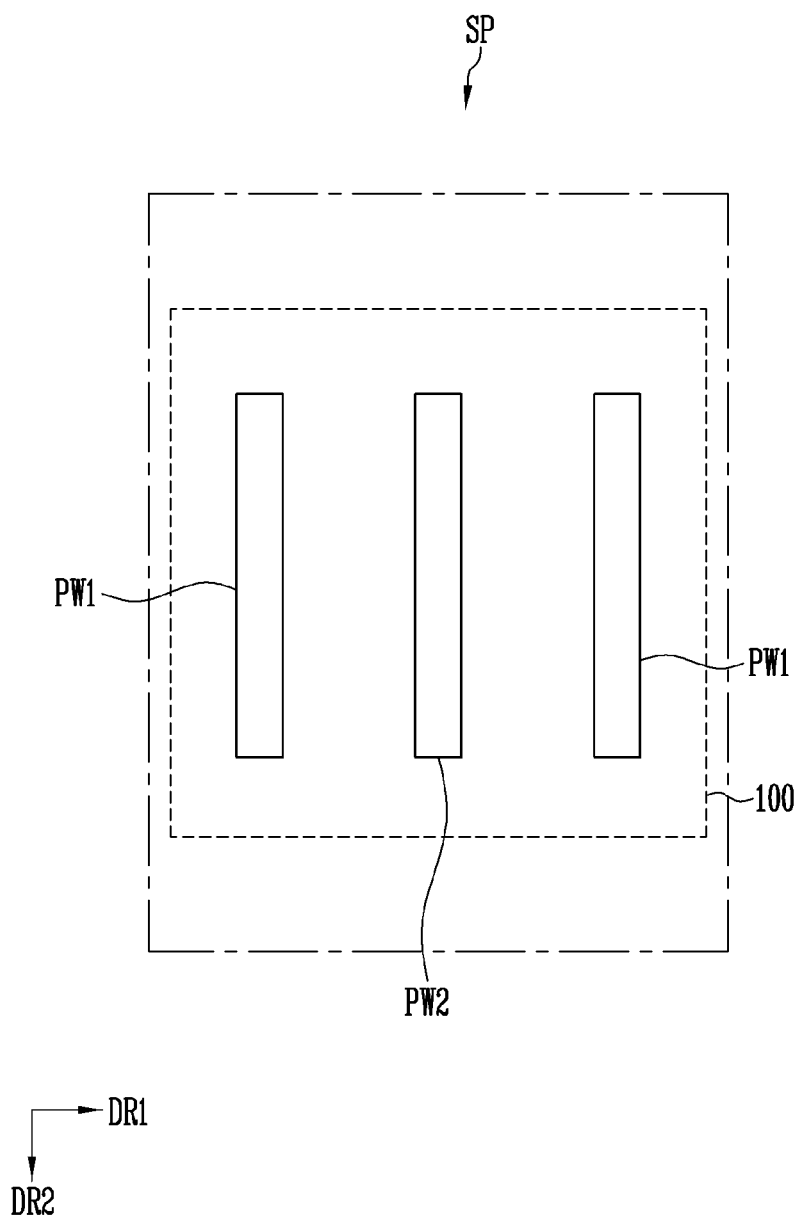

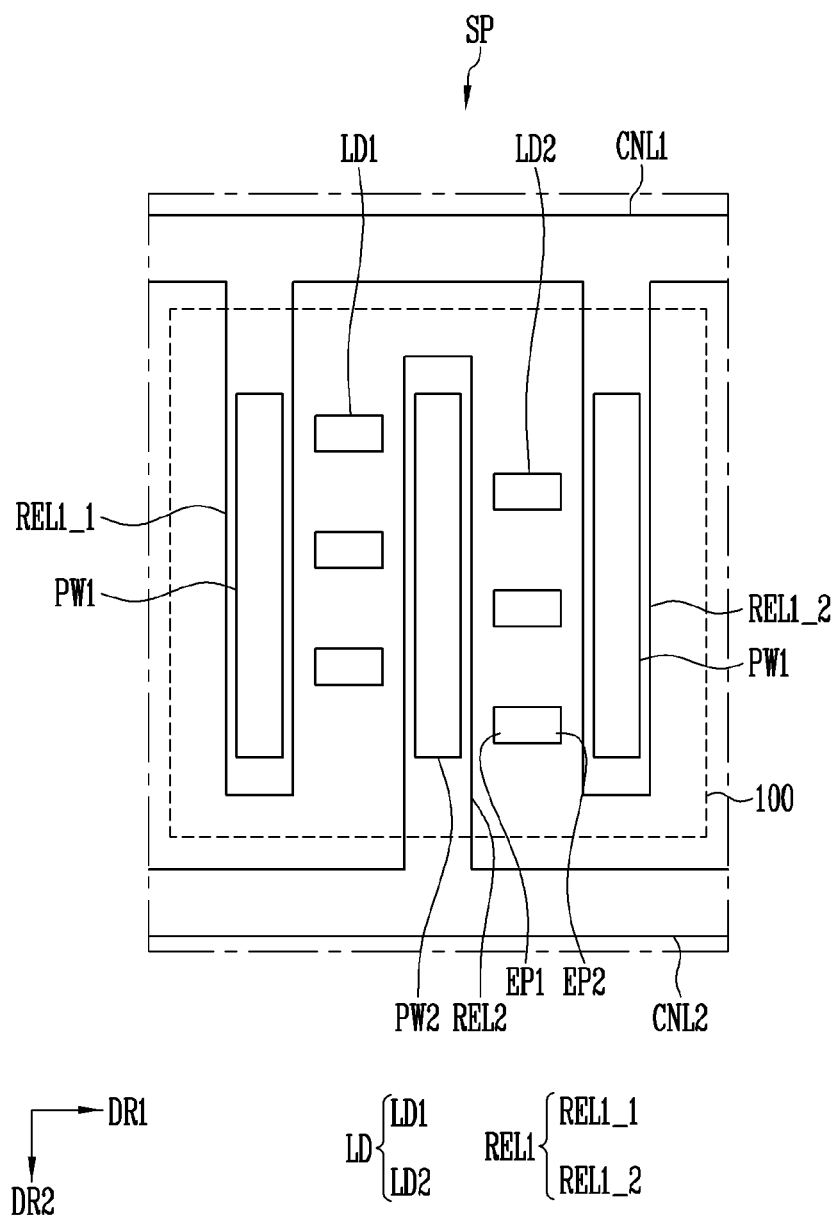

LIGHT-EMITTING DEVICE, MANUFACTURING METHOD THEREFOR, AND DISPLAY DEVICE COMPRISING SAME

CROSS-REFERENCE TO RELATED APPLICATIONS

The application is a national entry of International Application No. PCT/KR2019/000793, filed on Jan. 18, 2019, which claims under 35 U.S.C. §§ 119(a) and 365(b) priority to and benefits of Korean Patent Application No. 10-2018-0084709, filed on Jul. 20, 2018 in the Korean Intellectual Property Office, the entire contents of which are incorporated herein by reference.

BACKGROUND

1. Technical Field

Various embodiments of the disclosure relate to a light emitting device, a method of fabricating the light emitting device, and a display device having the light emitting device.

2. Description of Related Art

A light emitting diode (LED) may have relatively satisfactory durability even under poor environmental conditions, and have excellent performances in terms of lifetime and luminance. Recently, research on the technology of applying such LEDs to various display devices has become appreciably more active.

As a part of such research, technologies of fabricating a rod-type LED having a small size corresponding to the micro scale or the nano scale using an inorganic crystalline structure, e.g., a structure obtained by growing a nitride-based semiconductor are being developed. For example, rod-type LEDs may be fabricated in a small size enough to form a pixel of a self-luminance display device, etc.

SUMMARY

Various embodiments of the disclosure are directed to a light emitting device in which contact defects of subminiature light emitting diodes can be minimized, a method of fabricating (or manufacturing) the light emitting device, and a display device having the light emitting device.

According to an aspect of the disclosure, a light emitting device may include: a substrate including emission areas; a first electrode disposed on the substrate; a second electrode spaced apart from the first electrode, the first electrode and the second electrode being disposed on a same layer; at least one light emitting element disposed on the substrate, and including a first end and a second end with respect to a longitudinal direction of the at least one light emitting element; an insulating layer disposed on the light emitting element and allowing the first end and the second end of the at least one light emitting element to be exposed; a first contact electrode that electrically connects the first electrode with the first end of the at least one light emitting element; a second contact electrode spaced apart from the first contact electrode and electrically connecting the second electrode with the second end of the at least one light emitting element, the first contact electrode and the second contact electrode being disposed on a same layer; and a passivation pattern provided on each of the first contact electrode and the second contact electrode.

In an embodiment of the disclosure, the first contact electrode and the second contact electrode may be disposed on the insulating layer, spaced apart from each other, and electrically separated from each other.

In an embodiment of the disclosure, the passivation pattern may include an inorganic insulating layer formed of inorganic material.

In an embodiment of the disclosure, a distance between the first contact electrode and the second contact electrode may be less than a length of the at least one light emitting element.

In an embodiment of the disclosure, the passivation pattern disposed on the first contact electrode and the passivation pattern disposed on the second contact electrode may be spaced apart from each other by a distance equal to the distance between the first contact electrode and the second contact electrode.

In an embodiment of the disclosure, the insulating layer may include a first contact hole in which a portion of the first electrode is exposed, and a second contact hole in which a portion of the second electrode is exposed.

In an embodiment of the disclosure, the first contact electrode may be electrically connected to the first electrode through the first contact hole, and the second contact electrode may be electrically connected to the second electrode through the second contact hole.

In an embodiment of the disclosure, the light emitting device may further include: a first bank, or partition wall, disposed between the substrate and the first electrode; and a second bank, or partition wall, spaced apart from the first bank by a predetermined distance, and disposed between the substrate and the second electrode, the first bank and the second bank being disposed on a same layer.

In an embodiment of the disclosure, the at least one light emitting element may include: a first semiconductor layer, or conductive semiconductor layer, doped with a first conductive dopant; a second semiconductor layer, or conductive semiconductor layer, doped with a second conductive dopant; and an active layer disposed between the first semiconductor layer and the second semiconductor layer.

In an embodiment of the disclosure, the at least one light emitting element may include a light emitting diode having a shape of a cylinder or polyprism and having a micro-scale or nano-scale size.

According to an aspect of the disclosure, a method of fabricating a light emitting device may include: forming a first electrode and a second electrode on a substrate including emission areas, the first electrode and the second electrode being spaced apart from each other; forming a first insulating material layer on the substrate including the first and the second electrodes; aligning at least one light emitting element on the first insulating material layer between the first electrode and the second electrode by forming an electric field between the first electrode and the second electrode; forming a second insulating material layer on the first insulating material layer including the at least one light emitting element; forming, by removing portions of the first and second insulating material layers, a first insulating layer and an insulating material pattern disposed on the first insulating layer; forming a first contact hole exposing a portion of the first electrode and a second contact hole exposing a portion of the second electrode; forming, by removing a portion of the insulating material pattern, a second insulating layer allowing opposite ends of the at least one light emitting element to be exposed; forming a conductive layer and a third insulating material layer on the second insulating layer; forming, by removing a portion of the third insulating material layer, a passivation pattern allowing a portion of the conductive layer to be exposed; and forming, by removing a portion of the conductive layer using the passivation pattern as a mask, a first contact electrode electrically connected to the first electrode, and a second contact electrode electrically connected to the second electrode.

In an embodiment of the disclosure, the passivation pattern may include an inorganic insulating layer formed of an inorganic material.

In an embodiment of the disclosure, the forming of the passivation pattern may include forming a photoresist layer on the third insulating material; forming a photoresist pattern including an opening corresponding to an area of the second insulating layer using a mask; and removing a portion of the third insulating material layer that corresponds to the opening using the photoresist pattern as a mask.

In an embodiment of the disclosure, the forming of the first contact electrode and the second contact electrode may include forming the first contact electrode and the second contact electrode on a same layer electrically separated from each other.

In an embodiment of the disclosure, the forming of the first contact electrode and the second contact electrode may include forming the first and second contact electrodes to be spaced apart from each other by a distance less than a length of the at least one light emitting element.

In an embodiment of the disclosure, the method may comprise forming a first bank between the substrate and the first electrode; and forming a second bank between the substrate and the second electrode.

According to an aspect of the disclosure, a display device may include: a substrate including a display area and a non-display area; and a plurality of pixels disposed in the display area, and including at least one sub-pixel.

In an embodiment of the disclosure, the at least one sub-pixel may include a pixel circuit layer including at least one transistor; and a display element layer including an emission area through which light is emitted.

In an embodiment of the disclosure, the display element layer may include: a first electrode disposed on the pixel circuit layer; a second electrode spaced apart from the first electrode, the first electrode and the second electrode being disposed on a same layer; at least one light emitting element disposed on the pixel circuit layer, and including a first end and a second end with respect to a longitudinal direction of the at least one light emitting element; an insulating layer disposed on the at least one light emitting element and allowing the first end and the second end of the at least one light emitting element to be exposed; a first contact electrode that electrically connects the first electrode with the first end of the at least one light emitting element; a second contact electrode spaced apart from the first contact electrode, and electrically connecting the second electrode with the second end of the at least one light emitting element, the first contact electrode and the second contact electrode being disposed on a same layer; and a passivation pattern disposed on each of the first contact electrode and the second contact electrode. The first contact electrode and the second contact electrode may be disposed on the insulating layer, spaced apart from each other, and electrically separated from each other.

In an embodiment of the disclosure, the passivation pattern may include an inorganic insulating layer formed of an inorganic material.

In an embodiment of the disclosure, a distance between the first contact electrode and the second contact electrode may be less than a length of the at least one light emitting element.

In an embodiment of the disclosure, the passivation pattern disposed on the first contact electrode and the passivation pattern disposed on the second contact electrode may be spaced apart from each other by a distance equal to the distance between the first contact electrode and the second contact electrode.

In an embodiment of the disclosure, the insulating layer may include a first contact hole in which a portion of the first electrode is exposed; and a second contact hole in which a portion of the second electrode is exposed. The first contact electrode may be electrically connected to the first electrode through the first contact hole, and the second contact electrode may be electrically connected to the second electrode through the second contact hole.

In various embodiments of the disclosure, an insulating pattern including inorganic material may be disposed on a contact electrode, so that contact defects of a subminiature light emitting element can be minimized.

Various embodiments of the disclosure may provide a method of fabricating the light emitting device.

Various embodiments of the disclosure may provide a display device including the light emitting device.

BRIEF DESCRIPTION OF THE DRAWINGS

An additional appreciation according to the embodiments of the invention will become more apparent by describing in detail the embodiments thereof with reference to the accompanying drawings, wherein:

FIGS. 5A to 5F are schematic plan diagrams sequentially illustrating a method of fabricating the light emitting device of FIG. 2A.

DETAILED DESCRIPTION OF THE EMBODIMENTS

Figure 1A:
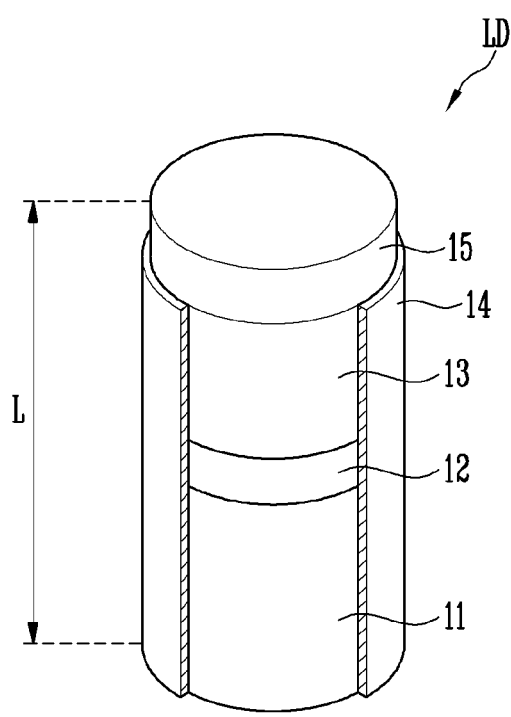
FIGS. 1A and 1B are schematic perspective views illustrating various types of light emitting elements in accordance with embodiments of the disclosure.

As the disclosure allows for various changes and numerous embodiments, particular embodiments will be illustrated in the drawings and described in detail in the written description. However, this is not intended to limit the disclosure to particular modes of practice, and it is to be appreciated that all changes, equivalents, and substitutes that do not depart from the spirit and technical scope of the disclosure are encompassed in the disclosure.

Throughout the disclosure, like reference numerals refer to like parts throughout the various figures and embodiments of the disclosure. The sizes of elements in the accompanying drawings may be exaggerated for clarity of illustration. It will be understood that, although the terms "first", "second", etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element. In the disclosure, the singular forms are intended to include the plural forms as well, unless the context clearly indicates otherwise.

It will be further understood that the terms "comprise," "include," "have," and the like, when used in this specification, specify the presence of stated features, integers, steps, operations, elements, components, and/or combinations of them but do not preclude the presence or addition of one or more other features, integers, steps, operations, elements, components, and/or combinations thereof. Furthermore, when a first part such as a layer, a film, a region, or a plate is disposed on a second part, the first part may be not only directly on the second part but a third part may intervene between them. In addition, when it is expressed that a first part such as a layer, a film, a region, or a plate is formed (or disposed) on a second part, the surface of the second part on which the first part is formed is not limited to an upper surface of the second part but may include other surfaces such as a side surface or a lower surface of the second part. To the contrary, when a first part such as a layer, a film, a region, or a plate is under a second part, the first part may be not only directly under the second part but a third part may be interposed between them.

In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Embodiments of the disclosure will hereinafter be described in detail with reference to the accompanying drawings.

Figure 1B:
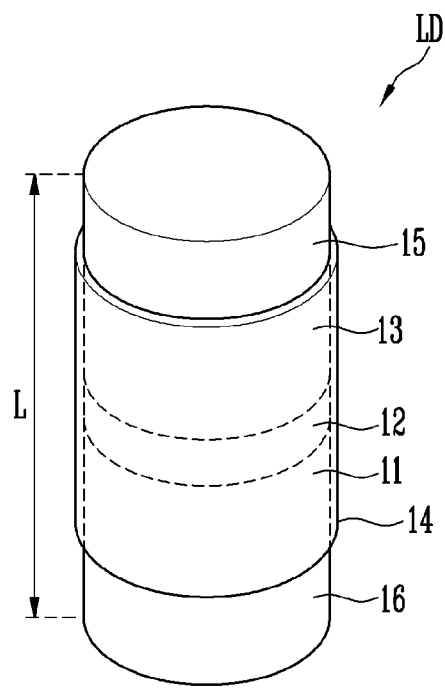

FIGS. 1A and 1B are schematic perspective views illustrating various types of light emitting elements in accordance with one or more embodiments of the disclosure. Although FIGS. 1A and 1B illustrate a cylindrical light emitting element, the disclosure is not limited thereto.

Referring to FIGS. 1A and 1B, the light emitting element LD in accordance with an embodiment of the disclosure may include a first conductive semiconductor layer 11, a second conductive semiconductor layer 13, and an active layer 12 interposed between the first and second conductive semiconductor layers 11 and 13.

For example, the light emitting element LD may be implemented as a stacked body formed by successively stacking the first conductive semiconductor layer 11, the active layer 12, and the second conductive semiconductor layer 13.

In an embodiment of the disclosure, the light emitting element LD may be provided in the form of a rod extending in one direction. If the direction in which the light emitting element LD extends is defined as a longitudinal direction, the light emitting element LD may have a first end and a second end in the longitudinal direction.

One of the first and second conductive semiconductor layers 11 and 13 may be disposed on the first end of the light emitting element LD, and the other of the first and second conductive semiconductor layers 11 and 13 may be disposed on the second end of the light emitting element LD.

Although the light emitting element LD may be provided in the form of a cylinder, the disclosure is not limited thereto. The light emitting element LD may have a rod-like shape or a bar-like shape extending in the longitudinal direction (i.e., to have an aspect ratio greater than 1). For example, a length L of the light emitting element LD in the longitudinal direction may be greater than the diameter thereof.

The light emitting element LD may include a light emitting diode fabricated in a subminiature size having a diameter and/or length corresponding, e.g., to a micro-scale or nano-scale size.

However, the size of the light emitting element LD is not limited to this, and the size of the light emitting element LD may be changed to meet requirements of a lighting device or a self-emissive display device to which the light emitting element LD is applied.

The first conductive semiconductor layer 11 may include, e.g., at least one n-type semiconductor layer. For instance, the first conductive semiconductor layer 11 may include a semiconductor layer which includes any one semiconductor material of InAlGaN, GaN, AlGaN, InGaN, AlN, and InN, and is doped with a first conductive dopant such as Si, Ge, or Sn.

The material forming the first conductive semiconductor layer 11 is not limited to this, and the first conductive semiconductor layer 11 may be formed of various other materials.

The active layer 12 may be formed on the first conductive semiconductor layer 11 and may have a single- or multi-quantum well structure. In an embodiment of the disclosure, a cladding layer (not shown) doped with a conductive dopant may be formed on and/or under the active layer 12. For example, the cladding layer may be formed of an AlGaN layer or an InAlGaN layer. Material such as AlGaN or AlInGaN may be employed to form the active layer 12.

If an electric field of a voltage equal to or greater than a predetermined voltage is applied to the opposite ends of the light emitting element LD, the light emitting element LD emits light by coupling of electron-hole pairs in the active layer 12.

The second conductive semiconductor layer 13 may be provided on the active layer 12 and may include a semiconductor layer of a type different from that of the first conductive semiconductor layer 11. For example, the second conductive semiconductor layer 13 may include at least one p-type semiconductor layer. For instance, the second conductive semiconductor layer 13 may include a semiconductor layer which includes any one semiconductor material of InAlGaN, GaN, AlGaN, InGaN, AlN, and InN, and is doped with a second conductive dopant such as Mg.

The material forming the second conductive semiconductor layer 13 is not limited to this, and the second conductive semiconductor layer 13 may be formed of various other materials.

In an embodiment of the disclosure, the light emitting element LD may further include one electrode layer 15 disposed on the second conductive semiconductor layer 13, as illustrated in FIG. 1A, as well as including the first conductive semiconductor layer 11, the active layer 12, and the second conductive semiconductor layer 13. In an embodiment, as shown in FIG. 1B, the light emitting element LD may further include another electrode layer 16 disposed on one end of the first conductive semiconductor layer 11 as well as including the electrode layer 15.

Although each of the electrode layers 15 and 16 may be formed of an ohmic contact electrode, the disclosure is not limited thereto. Each of the electrode layers 15 and 16 may include metal or a metal oxide. For example, chrome (Cr), titanium (Ti), aluminum (Al), gold (Au), nickel (Ni), an oxide or alloy thereof and ITO may be used alone or in combination with each other. However, the disclosure is not limited to this.

Materials included in the respective electrode layers 15 and 16 may be equal to or different from each other.

The electrode layers 15 and 16 may be transparent or semitransparent. Therefore, light generated from the light emitting element LD may pass through the electrode layers 15 and 16 and then be emitted outside the light emitting element LD.

In an embodiment of the disclosure, the light emitting element LD may further include an insulating film 14. In an embodiment of the disclosure, the insulating film 14 may be omitted, or may be provided to cover only some of the first conductive semiconductor layer 11, the active layer 12, and the second conductive semiconductor layer 13.

As illustrated in FIG. 1A, the insulating film 14 may be provided on a portion of the light emitting element LD at least other than one of opposite ends of the light emitting element LD. In this case, the insulating film 14 may expose only the one electrode layer 15 disposed on one end of the second conductive semiconductor layer 13 of the light emitting element LD and may enclose the overall side surfaces of the components at least other than the electrode layer 15. The insulating film 14 may allow at least the opposite ends of the light emitting element LD to be exposed to the outside. For example, the insulating film 14 may allow not only the electrode layer 15 disposed on one end of the second conductive semiconductor layer 13 but also one end of the first conductive semiconductor layer 11 to be exposed to the outside.

In an embodiment, as shown in FIG. 1B, in the case where the electrode layers 15 and 16 are disposed on the respective opposite ends of the light emitting element LD, the insulating film 14 may allow at least a portion of each of the electrode layers 15 and 16 to be exposed to the outside. In an embodiment, the insulating film 14 may not be provided.

In an embodiment of the disclosure, the insulating film 14 may include a transparent insulating material. For example, the insulating film 14 may include at least one insulating material selected from the group consisting of $SiO_2$, $Si_3N_4$, $Al_2O_3$, and $TiO_2$, but it is not limited thereto. In other words, various materials having insulating properties may be employed.

If the insulating film 14 is provided on the light emitting element LD, the active layer 12 may be prevented from short-circuiting with a first electrode and/or a second electrode which is not illustrated.

Thanks to the insulating film 14, occurrence of a defect on the surface of the light emitting element LD may be minimized, and the lifetime and efficiency of the light emitting element LD may be improved. In the case where multiple light emitting elements LD are disposed in close contact with each other, the insulating film 14 may prevent an undesired short-circuit from occurring between the light emitting elements LD.

The light emitting element LD may be employed as a light source for various display devices. The light emitting element LD may be fabricated through a surface treatment process.

Figure 2A:
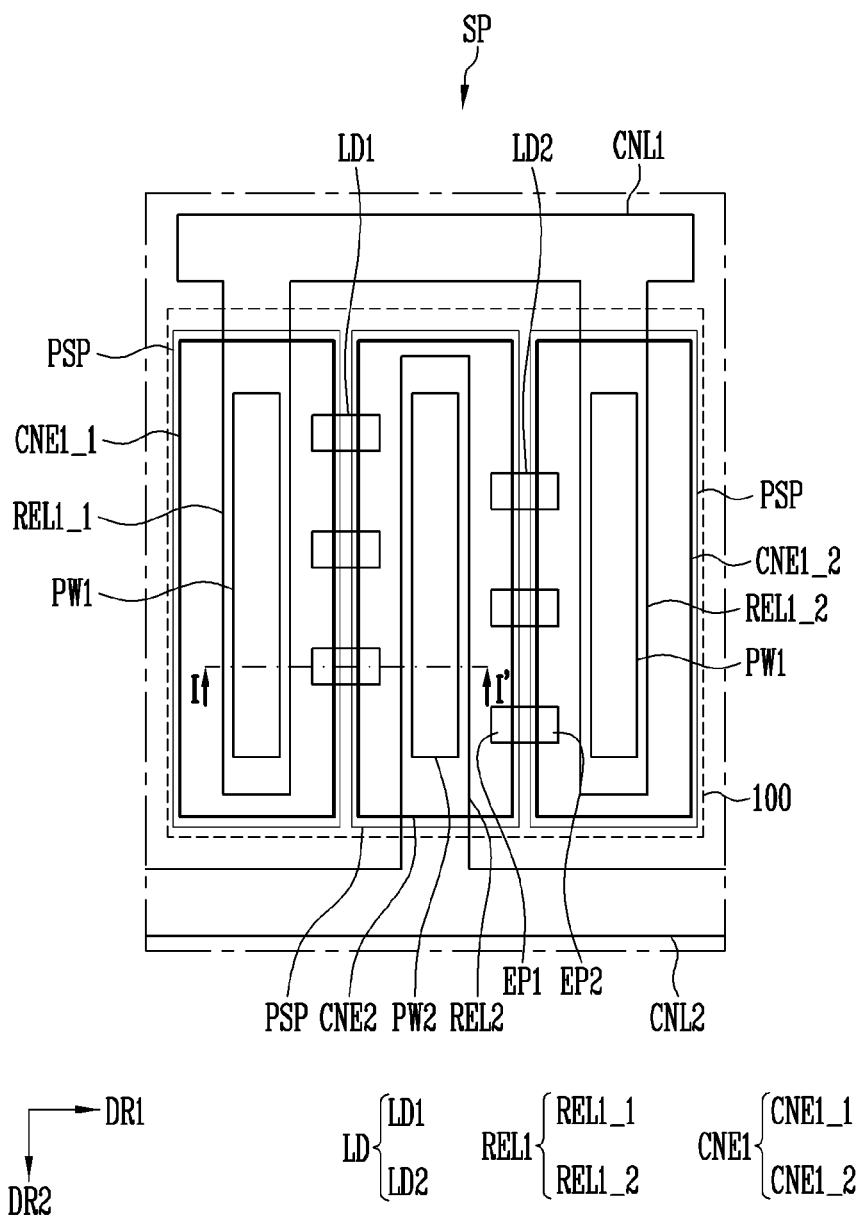
FIGS. 2A and 2B are schematic plan diagrams illustrating various types of unit emission areas of a light emitting device including the light emitting element of FIG. 1A.
Figure 2B:
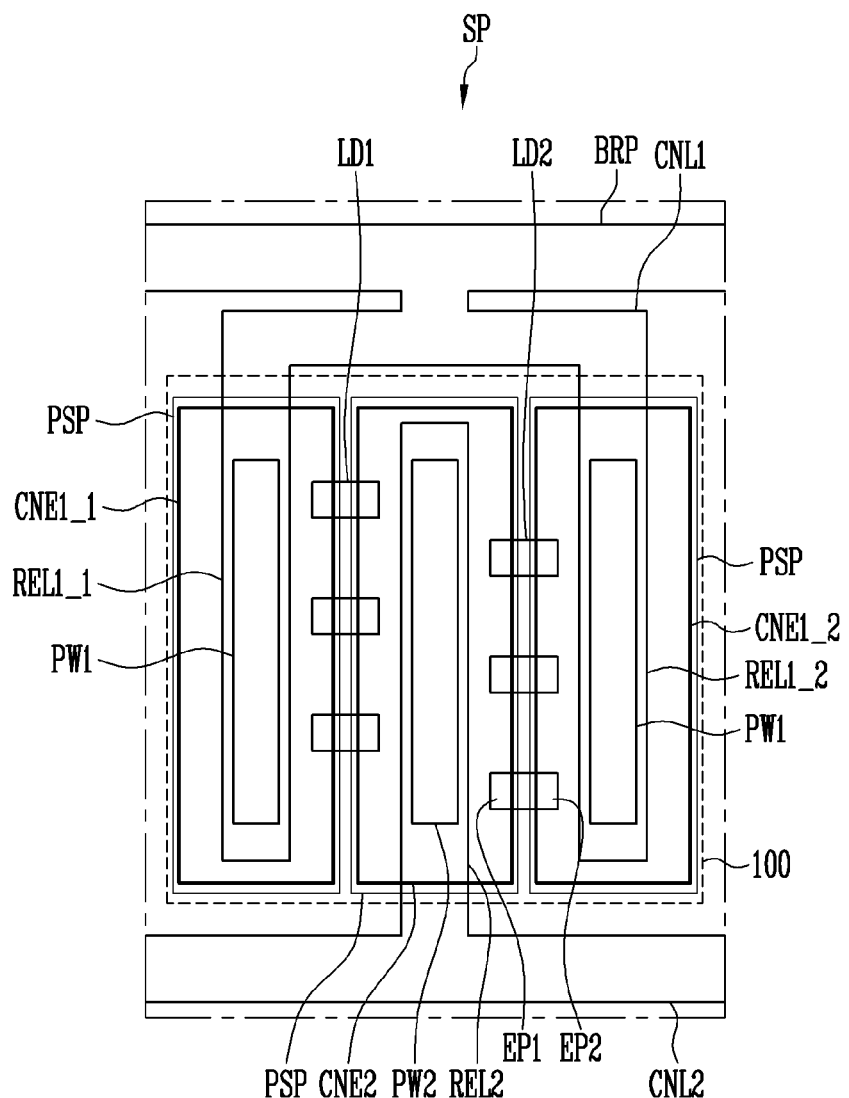
Figure 3:
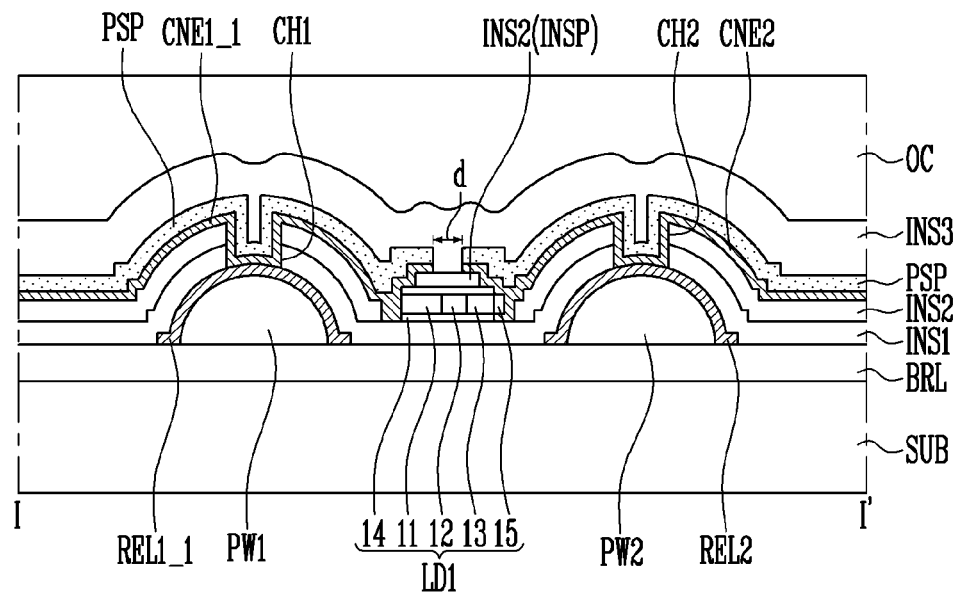
FIG. 3 is a schematic sectional diagram taken along line I-I' of FIG. 2A.
Figure 4:
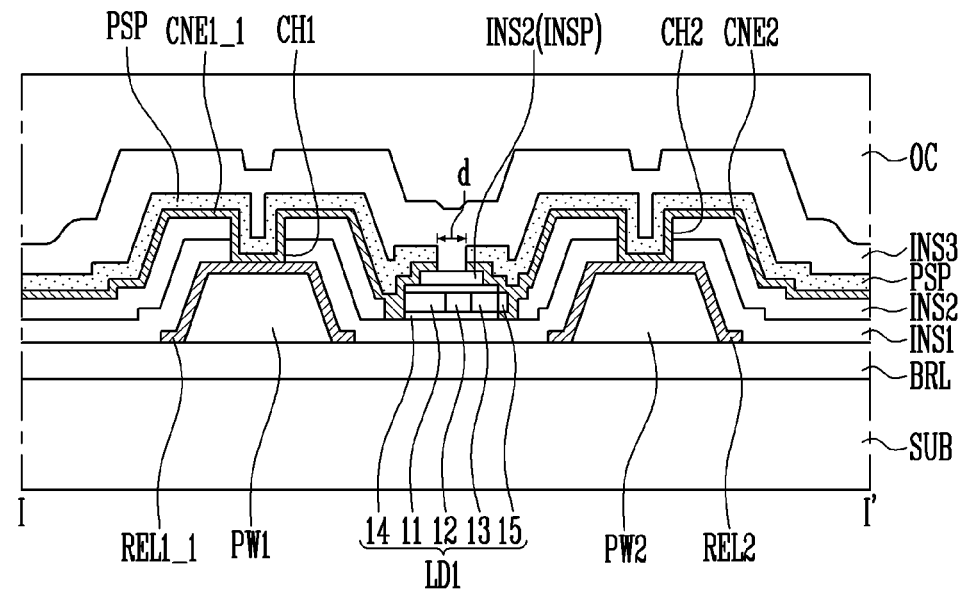
FIG. 4 schematically illustrates a light emitting device in accordance with an embodiment of the disclosure, and is a schematic sectional diagram corresponding to line I-I' of FIG. 2A.

FIGS. 2A and 2B are schematic plan diagrams illustrating various types of unit emission areas of a light emitting device including the light emitting element of FIG. 1A. FIG. 3 is a schematic sectional diagram taken along line I-I' of FIG. 2A. FIG. 4 schematically illustrates a light emitting device in accordance with an embodiment of the disclosure, and is a schematic sectional diagram corresponding to line I-I' of FIG. 2A.

Although the sake of convenience FIGS. 2A and 2B schematically illustrate that light emitting elements are aligned in a horizontal direction, the alignment of the light emitting elements is not limited thereto.

In FIGS. 2A and 2B, the unit emission area may be a pixel area of one of the sub-pixels included in an emission display panel.

Referring to FIGS. 1A, 2A, 2B, 3A, and 4, the light emitting device in accordance with an embodiment of the disclosure may include a substrate SUB including at least one sub-pixel SP having a unit emission area 100, and light emitting elements LD provided on the substrate SUB.

The substrate SUB may include an insulating material such as glass, an organic polymer, or crystal. The substrate SUB may be made of material having flexibility so as to be bendable or foldable, and may have a single-layer or multilayer structure.

For example, the substrate SUB may include at least one of the following: polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material of the substrate SUB may vary.

A barrier layer BRL for preventing impurities from diffusing into the light emitting elements LD may be provided on the substrate SUB.

In an embodiment of the disclosure, each of the light emitting elements LD may be formed of a light emitting diode which is made of material having an inorganic crystal structure and has a subminiature size, (e.g., nano scale or micro scale.)

Each of the light emitting elements LD may include a first conductive semiconductor layer 11, a second conductive semiconductor layer 13, and an active layer 12 interposed between the first and second conductive semiconductor layers 11 and 13. In some embodiments, each of the light emitting elements LD may further include an electrode layer 15 provided on one side of the second conductive semiconductor layer 13.

Each of the light emitting elements LD may include a first end EP1 and a second end EP2. One of the first and second conductive semiconductor layers 11 and 13 may be disposed on the first end EP1, and the other of the first and second conductive semiconductor layers 11 and 13 may be disposed on the second end EP2. In an embodiment of the disclosure, each of the light emitting elements LD may emit any one light of color light and/or white light.

A second insulating layer INS2 for covering a portion of an upper surface of each of the light emitting elements LD may be provided on the light emitting element LD. Hence, the opposite ends EP1 and EP2 of each of the light emitting elements LD may be exposed to the outside.

First and second partition walls PW1 and PW2, first and second connection lines CNL1 and CNL2, first and second electrodes REL1 and REL2, and first and second contact electrodes CNE1 and CNE2 may be provided in the unit emission area 100 of the sub-pixel SP.

The first and second partition walls PW1 and PW2 may be provided on the substrate SUB and define a unit emission area 100 of the light emitting device.

The first and second partition walls PW1 and PW2 may be disposed on the substrate SUB at positions spaced apart from each other by a predetermined distance. For example, the first partition wall PW1 and the second partition wall PW2 may be disposed on the substrate SUB at positions spaced apart from each other by a distance equal to or greater than a length L of one light emitting element LD illustrated in FIG. 1A.

As illustrated in FIG. 3, each of the first and second partition walls PW1 and PW2 may include a curved surface having a cross-sectional shape such as a semi-circle or a semi-ellipse, the width of which reduces from one surface of the substrate SUB toward an upper end of the cross-sectional shape, but the disclosure is not limited thereto. In an embodiment, as illustrated in FIG. 4, each of the first and second partition walls PW1 and PW2 may have a trapezoidal cross-section, the width of which reduces from the one surface of the substrate SUB toward an upper end of the cross-sectional shape.

In a sectional diagram, the shape of each of the first and second partition walls PW1 and PW2 is not limited to the foregoing examples, and may vary within a range in which the efficiency of light emitted from each of the light emitting elements LD can be enhanced.

The first and second partition walls PW1 and PW2 may be disposed on the same plane on the substrate SUB and may have the same height.

The first connection line CNL1 may extend in the sub-pixel SP in a first direction DR1. The first connection line CNL1 may be provided only in the sub-pixel SP so that the sub-pixel SP may be electrically separated from sub-pixels adjacent thereto. Hence, the sub-pixel SP may be driven independently from the sub-pixels adjacent thereto.

The second connection line CNL2 may extend in a direction parallel to a direction in which the first connection line CNL1 extends. The second connection line CNL2 may extend not only to the sub-pixel SP but also the sub-pixels adjacent to the sub-pixel SP. Hence, the sub-pixel SP and the sub-pixels adjacent thereto may be electrically connected in common to the second connection line CNL2.

The first electrode REL1 may include a 1-1-th electrode REL1_1 and a 1-2-th electrode REL1_2 which diverge from the first connection line CNL1 in a second direction DR2 intersecting the first direction DR1. The 1-1-th electrode REL1_1, the 1-2-th electrode REL1_2, and the first connection line CNL1 may be integrally provided and electrically and/or physically connected to each other. Each of the 1-1-th electrode REL1_1 and the 1-2-th electrode REL1_2 may have a bar shape extending in the second direction DR2 in a plan view.

The second electrode REL2 may diverge from the second connection line CNL2 in the second direction DR2 and be provided in the unit emission area 100 of the sub-pixel SP. The second electrode REL2 and the second connection line CNL2 may be integrally provided and electrically and/or physically connected to each other. The second electrode REL2 may have a bar shape extending in the second direction DR2 in a plan view.

In a plan view, the second electrode REL2 may be provided between the 1-1-th electrode REL1_1 and the 1-2-th electrode REL1_2 and may be spaced apart from each of the 1-1-th electrode REL1_1 and the 1-2-th electrode REL1_2 by a predetermined distance. The 1-1-th electrode REL1_1, the 1-2-th electrode REL1_2, and the second electrode REL2 may be alternately disposed on the substrate SUB.

Before the light emitting elements LD are aligned in the sub-pixel SP, a first alignment voltage may be applied to the first electrode REL1 through the first connection line CNL1, and a second alignment voltage may be applied to the second electrode REL2 through the second connection line CNL2. The first alignment voltage and the second alignment voltage may have different voltage levels.

As predetermined alignment voltages having different voltage levels are respectively applied to the first electrode REL1 and the second electrode REL2, an electric field may be formed between the first electrode REL1 and the second electrode REL2. The light emitting elements LD may be aligned on the substrate SUB between the first electrode REL1 and the second electrode REL2 by the electric field.

The first electrode REL1 and the second electrode REL2 may be respectively provided on the corresponding partition walls. For example, the first electrode REL1 may be provided on the first partition wall PW1, and the second electrode REL2 may be provided on the second partition wall PW2.

In the case where the first partition wall PW1 has a trapezoidal cross-section, the first electrode REL1 may have an inclined structure corresponding to an inclination of one side of the first partition wall PW1. In the case where the first partition wall PW1 has a semi-circular or semi-elliptical cross-section, the first electrode REL1 may have a curvature corresponding to a curved surface of the first partition wall PW1.

Likewise, in the case where the second partition wall PW2 has a trapezoidal cross-section, the second electrode REL2 may have an inclined structure corresponding to an inclination of a side of the second partition wall PW2. In the case where the second partition wall PW2 has a semi-circular or semi-elliptical cross-section, the second electrode REL2 may have a curvature corresponding to a curved surface of the second partition wall PW2.

The first and second electrodes REL1 and REL2 may be provided on the substrate SUB at positions spaced apart from each other with the light emitting elements LD interposed therebetween.

In an embodiment of the disclosure, the first electrode REL1 may be disposed adjacent to one of the opposite ends EP1 and EP2 of each of the light emitting elements LD, and may be electrically connected to the light emitting elements LD through the first contact electrode CNE1. The second electrode REL2 may be disposed adjacent to the other one of the opposite ends EP1 and EP2 of each of the light emitting elements LD, and may be electrically connected to the light emitting elements LD through the second contact electrode CNE2.

The first electrode REL1 and the second electrode REL2 may be disposed on the same plane, and may have the same height. If the first electrode REL1 and the second electrode REL2 have the same height, each of the light emitting elements LD may be more reliably electrically connected to the first and second electrodes REL1 and REL2.

The first and second electrodes REL1 and REL2 may be formed of conductive material. The conductive material may include metal such as Ag, Mg, Al, Pt, Pd, Au, Ni, Nd, Ir, Cr, or an alloy of them, a conductive oxide such as an indium tin oxide (ITO), an indium zinc oxide (IZO), a zinc oxide (ZnO), or an indium tin zinc oxide (ITZO), and a conductive polymer such as PEDOT.

Each of the first and second electrodes REL1 and REL2 may have a single layer structure, but the disclosure is not limited thereto. For example, it may have a multilayer structure formed by stacking two or more materials of metals, alloys, conductive oxides, and conductive polymers.

The material of the first and second electrodes REL1 and REL2 is not limited to the above-mentioned materials. For example, the first and second electrodes REL1 and REL2 may be made of conductive material having a predetermined reflectivity to allow light emitted from the opposite ends EP1 and EP2 of the light emitting elements LD to travel in a direction (e.g., in a frontal direction) in which an image is displayed.

Since the first and second electrodes REL1 and REL2 have shapes corresponding to the shapes of the first and second partition walls PW1 and PW2, light emitted from the opposite ends EP1 and EP2 of each of the light emitting elements LD may be reflected by the first and second electrodes REL1 and REL2, whereby the light may more effectively travel in the frontal direction. Consequently, the efficiency of light emitted from the light emitting elements LD may be enhanced.

In an embodiment of the disclosure, the first and second partition walls PW1 and PW2, along with the first and second electrodes REL1 and REL2 provided on the first and second partition walls PW1 and PW2, may function as reflective components for enhancing the efficiency of light emitted from each of the light emitting elements LD.

Although for the sake of explanation the first and second electrodes REL1 and REL2 are illustrated as being directly provided on the substrate SUB, the disclosure is not limited thereto. For example, a component for enabling the display device to be driven as a passive matrix or an active matrix may be further provided between the substrate SUB and the first and second electrodes REL1 and REL2.

In the case where the light emitting device is driven as the active matrix, signal lines, an insulating layer, and/or a transistor may be provided between the substrate SUB and the first and second electrodes REL1 and REL2.

The signal lines may include a scan line, a data line, a power line, etc. The transistor may be electrically connected to the signal lines and include a gate electrode, a semiconductor layer, a source electrode, and a drain electrode.

Any one of the first and second electrodes REL1 and REL2 may be an anode electrode, and the other may be a cathode electrode. In an embodiment of the disclosure, the first electrode REL1 may be an anode electrode, and the second electrode REL2 may be cathode electrode.

In this case, one electrode of the source and drain electrodes of the transistor may be electrically connected to any one electrode of the first and second electrodes REL1 and REL2. A data signal of the data line may be applied to the any one electrode through the transistor. Here, the numbers and shapes of signal lines, insulating layer, and/or transistors may vary.

In an embodiment of the disclosure, the first electrode REL1 may be electrically connected to the transistor through a contact hole (not illustrated). Hence, a signal provided to the transistor may be applied to the first electrode REL1.

In the case where the light emitting device is driven as an active matrix, the second electrode REL2 may be electrically connected to the signal line through the contact hole (not illustrated). Hence, a voltage of the signal line may be applied to the second electrode REL2.

In an embodiment of the disclosure, the light emitting elements LD may be divided into first light emitting elements LD1 aligned between the 1-1-th electrode REL1_1 and the second electrode REL2, and second light emitting elements LD2 aligned between the second electrode REL2 and the 1-2-th electrode REL1_2.

A first end EP1 of each of the first light emitting elements LD1 may be electrically connected to the 1-1-th electrode REL1_1 through the first contact electrode CNE1. Hence, a signal of the transistor may be transmitted to the first end EP1 of each of the first light emitting elements LD1. A second end EP2 of each of the first light emitting elements LD1 may be electrically connected to the second electrode REL2 through the second contact electrode CNE2. Hence, a voltage of the signal line may be transmitted to the second end EP2 of each of the first light emitting elements LD1.

A first end EP1 of each of the second light emitting elements LD2 may be electrically connected to the second electrode REL2 through the second contact electrode CNE2. Hence, a voltage of the signal line may be transmitted to the first end EP1 of each of the second light emitting elements LD2. A second end EP2 of each of the second light emitting elements LD2 may be electrically connected to the 1-2-th electrode REL1_2 through the first contact electrode CNE1. Hence, a signal of the transistor may be transmitted to the second end EP2 of each of the second light emitting elements LD2.

The first and second light emitting elements LD1 and LD2 may form (or constitute) constitute a light source of the sub-pixel SP. For example, if driving current flows through the sub-pixel SP during each frame period, the light emitting elements LD electrically connected to the first and second electrodes REL1 and REL2 of the sub-pixel SP may emit light having a luminance corresponding to the driving current.

A first insulating layer INS1 may be provided on the first and second electrodes REL1 and REL2. The first insulating layer INS1 may be provided between the substrate SUB and each of the light emitting elements LD.

A space between the substrate SUB and each of the light emitting elements LD may be filled with the first insulating layer INS1. The first insulating layer INS1 may stably support the light emitting element LD and prevent the light emitting element LD from being removed from the substrate SUB.

The first insulating layer INS1 may include a first contact hole CH1 in which a portion of the first electrode REL1 is exposed, and a second contact hole CH2 in which a portion of the second electrode REL2 is exposed.

The second insulating layer INS2, may be provided on the first insulating layer INS1. The second insulating layer INS2 may also include a first contact hole CH1 corresponding to the first contact hole CH1 of the first insulating layer INS1, and a second contact hole CH2 corresponding to the second contact hole CH2 of the first insulating layer INS1.

In the following embodiments, for the sake of convenience, the first contact hole CH1 of the first insulating layer INS1 and the first contact hole CH1 of the second insulating layer INS2 will be integrally referred to as one first contact hole CH1. The second contact hole CH2 of the first insulating layer INS1 and the second contact hole CH2 of the second insulating layer INS2 will be integrally referred to as one second contact hole CH2.

The second insulating layer INS2 may be provided on a portion of the upper surface of each of the light emitting elements LD and may allow the opposite ends EP1 and EP2 of each of the light emitting elements LD to be exposed. In the following embodiments, for the sake of convenience, the second insulating layer INS2 provided on the portion of the upper surface of each of the light emitting elements LD will be referred to as an insulating pattern INSP.

The first contact electrode CNE1 may be provided on the second insulating layer INS2 to electrically and/or physically and reliably connect the first electrode REL1 with any one of the opposite ends EP1 and EP2 of each of the light emitting elements LD.

The first contact electrode CNE1 may be formed of transparent conductive material to allow light emitted from each of the light emitting elements LD and reflected by the first electrode REL1 to travel in the frontal direction without loss. For example, the transparent conductive material may include ITO, IZO, ITZO, etc. The material of the first contact electrode CNE1 is not limited to the above-mentioned materials.

In a plan view, the first contact electrode CNE1 may cover and/or overlap the first electrode REL1. The first contact electrode CNE1 may partially overlap one of the opposite ends EP1 and EP2 of each of the light emitting elements LD.

The first contact electrode CNE1 may be electrically connected to the first electrode REL1 through the first contact hole CH1 of the first and second insulating layers INS1 and INS2.

In an embodiment of the disclosure, the first contact electrode CNE1 may include a 1-1-th contact electrode CNE1_1 provided on the 1-1-th electrode REL1_1, and a 1-2-th contact electrode CNE1_2 provided on the 1-2-th electrode REL1_2.

The second contact electrode CNE2 may be provided on the second insulating layer INS2. In a plan view, the second contact electrode CNE2 may cover the second electrode REL2 and overlap the second electrode REL2. The second contact electrode CNE2 may overlap the second end EP2 of each of the first light emitting elements LD1 and the first end EP1 of each of the second light emitting elements LD2.

The second contact electrode CNE2 may be electrically connected to the second electrode REL2 through the second contact hole CH2 of the first and second insulating layers INS1 and INS2. The second contact electrode CNE2 and the first contact electrode CNE1 may be made of the same material, but the disclosure is not limited thereto.

The first contact electrode CNE1 and the second contact electrode CNE2 may be provided on the same plane, and may be disposed on the insulating pattern INSP at positions spaced apart from each other by a predetermined distance d so that the first and second contact electrodes CNE1 and CNE2 can be electrically separated from each other. In an embodiment of the disclosure, the first contact electrode CNE1 may overlap a first side of the insulating pattern INSP, and the second contact electrode CNE2 may overlap a second side of the insulating pattern INSP.

Passivation patterns PSP may be respectively provided on the first contact electrode CNE1 and the second contact electrode CNE2.

The passivation patterns PSP may respectively prevent the first and second contact electrodes CNE1 and CNE2 from being exposed to the outside, thus preventing the first and second contact electrodes CNE1 and CNE2 from corroding. The passivation patterns PSP may respectively prevent the first and second contact electrodes CNE1 and CNE2 from undesirably short-circuiting because of defects or the like caused during a process of forming the first and second contact electrodes CNE1 and CNE2.

The passivation patterns PSP each may include an inorganic insulating layer formed of inorganic material. The inorganic material may include, e.g., at least one of silicon nitride, silicon oxide, and silicon oxynitride. Particularly, the silicon nitride among the inorganic materials may have characteristics of excellent adhesive force with the transparent conductive material. Therefore, in the case where the passivation pattern PSP formed of the silicon nitride is disposed on the first and second contact electrodes CNE1 and CNE2 formed of transparent conductive material, the first and second contact electrodes CNE1 and CNE2 may be prevented from peeling, and satisfactory interface characteristics between the passivation pattern PSP and each of the first and second contact electrodes CNE1 and CNE2 may be obtained.

In this case, an etchant used during the process of forming the first and second contact electrodes CNE1 and CNE2 cannot penetrate into an interface between the passivation pattern PSP and each of the first and second contact electrodes CNE1 and CNE2. Therefore, the first and second contact electrodes CNE1 and CNE2 may be prevented from undesirably short-circuiting because of the etchant.

In a plan view, the passivation pattern PSP may overlap each of the first and second contact electrodes CNE1 and CNE2.

The passivation pattern (hereinafter, referred to as 'first passivation pattern') PSP provided on the first contact electrode CNE1 may have a bar shape extending in a direction in which the first contact electrode CNE1 extends, but the disclosure is not limited thereto. In an embodiment, the first passivation pattern PSP may be changed in various shapes within a range in which the first passivation pattern PSP can completely cover the first contact electrode CNE1.

The passivation pattern PSP provided on the second contact electrode CNE2 (hereinafter referred to as "second passivation pattern") may have a bar shape extending in a direction in which the second contact electrode CNE2 extends, but the disclosure is not limited thereto. In an embodiment, the second passivation pattern PSP may also be changed in various shapes within a range in which the second passivation pattern PSP can completely cover the second contact electrode CNE2.

In a plan view, the first passivation pattern PSP and the second passivation pattern PSP may be spaced apart from each other. In an embodiment of the disclosure, the first passivation pattern PSP may overlap a first side of the insulating pattern INSP and may correspond to the first contact electrode CNE1. The second passivation pattern PSP may overlap a second side of the insulating pattern INSP and may correspond to the second contact electrode CNE2. Hence, a portion of the upper surface of the insulating pattern INSP may be exposed.

A distance between the first passivation pattern PSP and the second passivation pattern PSP may be equal to or greater than a distance d between the first contact electrode CNE1 and the second contact electrode CNE2.

A third insulating layer INS3 may be provided on the passivation pattern PSP and the exposed insulating pattern INSP. The third insulating layer INS3 may be formed of an inorganic insulating layer including inorganic material, or an organic insulating layer including organic material. Although the third insulating layer INS3 may have a single layer structure as shown in FIGS. 3 and 4, the disclosure is not limited thereto. For example, the third insulating layer INS3 may have a multi-layer structure.

An overcoat layer OC may be provided on the third insulating layer INS3.

The overcoat layer OC may be a planarization layer for mitigating height differences between top surfaces formed by the first and second partition walls PW1 and PW2, the first and second electrodes REL1 and REL2, the first and second contact electrodes CNE1 and CNE2, etc., that are disposed under the overcoat layer OC. The overcoat layer OC may function as an encapsulation layer for preventing oxygen or water from penetrating into the light emitting elements LD.

In some embodiments, the overcoat layer OC may be omitted. In the case where the overcoat layer OC is omitted, the third insulating layer INS3 may function as an encapsulation layer for preventing oxygen or water from penetrating into the light emitting elements LD.

As described above, predetermined voltages may be respectively applied to the opposite ends EP1 and EP2 of each of the first light emitting elements LD1 through the 1-1-th electrode REL1_1 and the second electrode REL2. Hence, each of the first light emitting elements LD1 may emit light by coupling of electron-hole pairs in the active layer 12 of each of the first light emitting elements LD1.

Predetermined voltages may be respectively applied to the opposite ends EP1 and EP2 of each of the second light emitting elements LD2 through the second electrode REL2 and the 1-2-th electrode REL1_2. Hence, each of the second light emitting elements LD2 may emit light by coupling of electron-hole pairs in the active layer 12 of each of the second light emitting elements LD2.

In an embodiment, the unit emission area 100 of the sub-pixel SP may further include a bridge pattern BRP extending in the first direction DR1, as illustrated in FIG. 2B.

The bridge pattern BRP may be integrally provided with the first connection line CNL1 and electrically and physically connected to the first connection line CNL1. In this case, the first alignment voltage may be transmitted to the first connection line CNL1 through the bridge pattern BRP. The first alignment voltage transmitted to the first connection line CNL1 may be supplied to the 1-1-th electrode REL1_1 and the 1-2-th electrode REL1_2 that diverge from the first connection line CNL1.

Hereinafter, the configuration of the display device according to an embodiment of the disclosure will be described in a stacking sequence with reference to FIGS. 2A and 3.

The first and second partition walls PW1 and PW2 may be provided on the substrate SUB on which the barrier layer BRL is provided. The first and second partition walls PW1 and PW2 may be disposed on the substrate SUB at positions spaced apart from each other by a predetermined distance.

The first electrode REL1 may be provided on the first partition wall PW1. The second electrode REL2 may be provided on the second partition wall PW2. The first electrode REL1 and the second electrode REL2 may be provided on the same plane on the corresponding partition walls, and may have shapes corresponding to the shapes of the corresponding partition walls.

A first insulating layer INS1 may be provided on the first electrode REL1 and the second electrode REL2. The first insulating layer INS1 may be formed of an inorganic insulating layer including inorganic material, or an organic insulating layer including organic material.

The first insulating layer INS1 may include the first contact hole CH1 in which a portion of the first electrode REL1 is exposed, and the second contact hole CH2 in which a portion of the second electrode REL2 is exposed.

In an embodiment, a capping layer (not illustrated) may be provided between the first electrode REL1 and the first insulating layer INS1 and/or between the second electrode REL2 and the first insulating layer INS1. The capping layer may prevent the first electrode REL1 and the second electrode REL2 from being damaged because of defects or the like caused during the process of fabricating the light emitting device. The capping layer may reinforce adhesive force between the substrate SUB and each of the first and second electrodes REL1 and REL2. The capping layer may be formed of transparent conductive material to allow light emitted from each of the light emitting elements LD to travel in the frontal direction without loss.

The light emitting elements LD may be aligned on the first insulating layer INS1. The light emitting elements LD may be aligned on the first insulating layer INS' between the first electrode REL1 and the second electrode REL2.

The second insulating layer INS2 may be provided on the first insulating layer INS1 that includes the light emitting elements LD. In an embodiment of the disclosure, the second insulating layer INS2 may be provided on a portion of the upper surface of each of the light emitting elements LD. The second insulating layer INS2 provided on the portion of the upper surface of each of the light emitting elements LD may be the insulating pattern INSP.

The second insulating layer INS2 may include the first contact hole CH1 in which a portion of the first electrode REL1 is exposed, and the second contact hole CH2 in which a portion of the second electrode REL2 is exposed. The insulating pattern INSP may be disposed on a portion of the upper surface of each of the light emitting elements LD such that the opposite ends EP1 and EP2 of each of the light emitting elements LD may be exposed.

The second insulating layer INS2 may be formed of an inorganic insulating layer including inorganic material, or an organic insulating layer including organic material.

The first contact electrode CNE1 and the second contact electrode CNE2 may be provided on the second insulating layer INS2 and the insulating pattern INSP.

The first contact electrode CNE1 provided on the second insulating layer INS2 may be electrically connected to the first electrode REL1 through the first contact hole CH1. The second contact electrode CNE2 provided on the second insulating layer INS2 may be electrically connected to the second electrode REL2 through the second contact hole CH2.

The first contact electrode CNE1 may be provided on a first side of the insulating pattern INSP and partially overlap the insulating pattern INSP. The second contact electrode CNE2 may be provided on a second side of the insulating pattern INSP and partially overlap the insulating pattern INSP. The first contact electrode CNE1 and the second contact electrode CNE2 may be disposed on the insulating pattern INSP at positions spaced apart from each other by a predetermined distance d so that the first and second contact electrodes CNE1 and CNE2 can be electrically separated from each other.

The distance d between the first contact electrode CNE1 and the second contact electrode CNE2 that are disposed on the insulating pattern INSP at positions spaced apart from each other may be less than the length L of one light emitting element LD illustrated in FIG. 1A. The distance d between the first contact electrode CNE1 and the second contact electrode CNE2 may be equal to a lateral width of the insulating pattern INSP or may be less than the lateral width of the insulating pattern INSP.

The first passivation pattern PSP may be provided on the first contact electrode CNE1. The second passivation pattern PSP may be provided on the second contact electrode CNE2.

The first passivation pattern PSP and the second passivation pattern PSP each may be an inorganic insulating layer formed of inorganic material. For example, the first passivation pattern PSP and the second passivation pattern PSP may include silicon nitride.

The first passivation pattern PSP may be provided on the first contact electrode CNE1 to cover the first contact electrode CNE1 and may prevent the first contact electrode CNE1 from corroding. The second passivation pattern PSP may be provided on the second contact electrode CNE2 to cover the second contact electrode CNE2 and may prevent the second contact electrode CNE2 from corroding.

The first passivation pattern PSP and the second passivation pattern PSP may be disposed on the insulating pattern INSP at positions spaced apart from each other by a predetermined distance.

The third insulating layer INS3 may be provided on the first passivation pattern PSP and the second passivation pattern PSP. The overcoat layer OC may be provided on the third insulating layer INS3.

As described above, in the light emitting device in accordance with an embodiment of the disclosure, the first contact electrode CNE1 and the second contact electrode CNE2 may be simultaneously formed, so that the fabricating process may be simplified.

Since the passivation patterns PSP are respectively provided on the first and second contact electrodes CNE1 and CNE2, an etchant used during the process of forming the first and second contact electrodes CNE1 and CNE2 cannot penetrate into the first and second contact electrodes CNE1 and CNE2. Thus, the first and second contact electrodes CNE1 and CNE2 may be prevented from undesirably short-circuiting because of the etchant. Accordingly, in the light emitting device in accordance with the embodiment of the disclosure, contact defects of the light emitting elements LD resulting from an undesirable short-circuit of the first or second contact electrode CNE1 or CNE2 may be minimized. Therefore, the light emitting efficiency of each of the light emitting elements LD can be enhanced.

FIGS. 5A to 5F are schematic plan diagrams sequentially illustrating a method of fabricating the light emitting device of FIG. 2A. FIGS. 6A to 6K are sectional diagrams sequentially illustrating a method of fabricating the light emitting device of FIG. 3.

Referring to FIGS. 1A, 2A, 3, 5A, and 6A, a first partition wall PW1 and a second partition wall PW2 that extend in a second direction DR2 may be formed on the substrate SUB of the unit emission area 100 of one sub-pixel SP on which the barrier layer BRL is formed.

The first partition wall PW1 and the second partition wall PW2 may be alternately disposed in a first direction DR1 intersecting the second direction DR2. The first partition wall PW1 and the second partition wall PW2 may be spaced apart from each other by a predetermined distance in the first direction DR1.

Each of the first partition wall PW1 and the second partition wall PW2 may include a curved surface having a cross-sectional shape such as a semi-circle, or a semi-ellipse, the width of which reduces from one surface of the substrate SUB toward an upper end of the cross-sectional shape, but the disclosure is not limited thereto. In an embodiment, each of the first partition wall PW1 and the second partition wall PW2 may have various shapes within a range in which the efficiency of light emitted from each of the light emitting elements LD can be enhanced. The shape, the size, and/or the arrangement structure of each of the first partition wall PW1 and the second partition wall PW2 may vary depending on embodiments.

Referring to FIGS. 1A, 2A, 3, 5B, 6A, and 6B, after a first conductive layer (not illustrated) is formed on the substrate SUB including the first and second partition walls PW1 and PW2, first and second connection lines CNL1 and CNL2 and first and second electrodes REL1 and REL2 are formed by patterning the first conductive layer using a mask.

The first electrode REL1 may extend from the first connection line CNL1 in the second direction DR2. The second electrode REL2 may extend from the second connection line CNL2 in the second direction DR2. The first connection line CNL1 and the first electrode REL1 may be integrally provided. The second connection line CNL2 and the second electrode REL2 may be integrally provided.

The first electrode REL1 may be formed on the first partition wall PW1, and the second electrode REL2 may be formed on the second partition wall PW2.

The first electrode REL1 may include a 1-1-th electrode REL1_1 and a 1-2-th electrode REL1_2 which diverge from the first connection line CNL1 with the second electrode REL2 interposed therebetween. The 1-1-th electrode REL1_1, the 1-2-th electrode REL1_2, and the second electrode REL2 may be disposed on the same plane at positions spaced apart from each other by a predetermined distance.

In an embodiment of the disclosure, not only the one sub-pixel SP but also sub-pixels (not illustrated) adjacent to the one sub-pixel SP in the first direction DR1 may be electrically connected in common to the first connection line CNL1. Likewise, the sub-pixel SP and the sub-pixels adjacent thereto may also be electrically connected in common to the second connection line CNL2.

Referring to FIGS. 1A, 2A, 3, 5C, 5D, and 6A to 6C, a first insulating material layer INSM1 is formed on the first and second electrodes REL1 and REL2. The first insulating material layer INSM1 may be formed of an inorganic insulating layer including inorganic material, or an organic insulating layer including organic material.

Thereafter, an electric field is formed between the first electrode REL1 and the second electrode REL2 by respectively applying corresponding alignment voltages to the first and second electrodes REL1 and REL2 through the first and second connection lines CNL1 and CNL2. In the case where alternating current power or direct current power having predetermined voltage and period is repeatedly applied several times to each of the first and second electrodes REL1 and REL2 through the first and second connection lines CNL1 and CNL2, an electric field may be formed between the first and second electrodes REL1 and REL2 by a difference in potential between the first and second electrodes REL1 and REL2.

While the electric field is formed between the first electrode REL1 and the second electrode REL2, light emitting elements LD are supplied onto the substrate SUB by an inkjet printing method or the like. For example, the light emitting elements LD may be supplied onto the substrate SUB of the unit emission area 100 by disposing a nozzle over the substrate SUB and dropping a solution in which the light emitting elements LD are dispersed onto the substrate SUB through the nozzle. The solution may be any one of acetone, water, alcohol, and toluene, but the disclosure is not limited thereto. The solution may include material that may be vaporized at the room temperature or by heat. Furthermore, the solution may have the form of ink or paste.

The method of supplying the light emitting elements LD onto the substrate SUB is not limited the foregoing method. The method of supplying the light emitting elements LD may vary. Subsequently, the solution may be removed.

If the light emitting elements LD are supplied onto the substrate SUB, self-alignment of the light emitting elements LD may be induced by the electric field formed between the first electrode REL1 and the second electrode REL2. Hence, the light emitting elements LD may be aligned between the first electrode REL1 and the second electrode REL2.

In an embodiment of the disclosure, each of the light emitting elements LD may be aligned on the first insulating material layer INSM1 between the first electrode REL1 and the second electrode REL2.

Figure 5B:
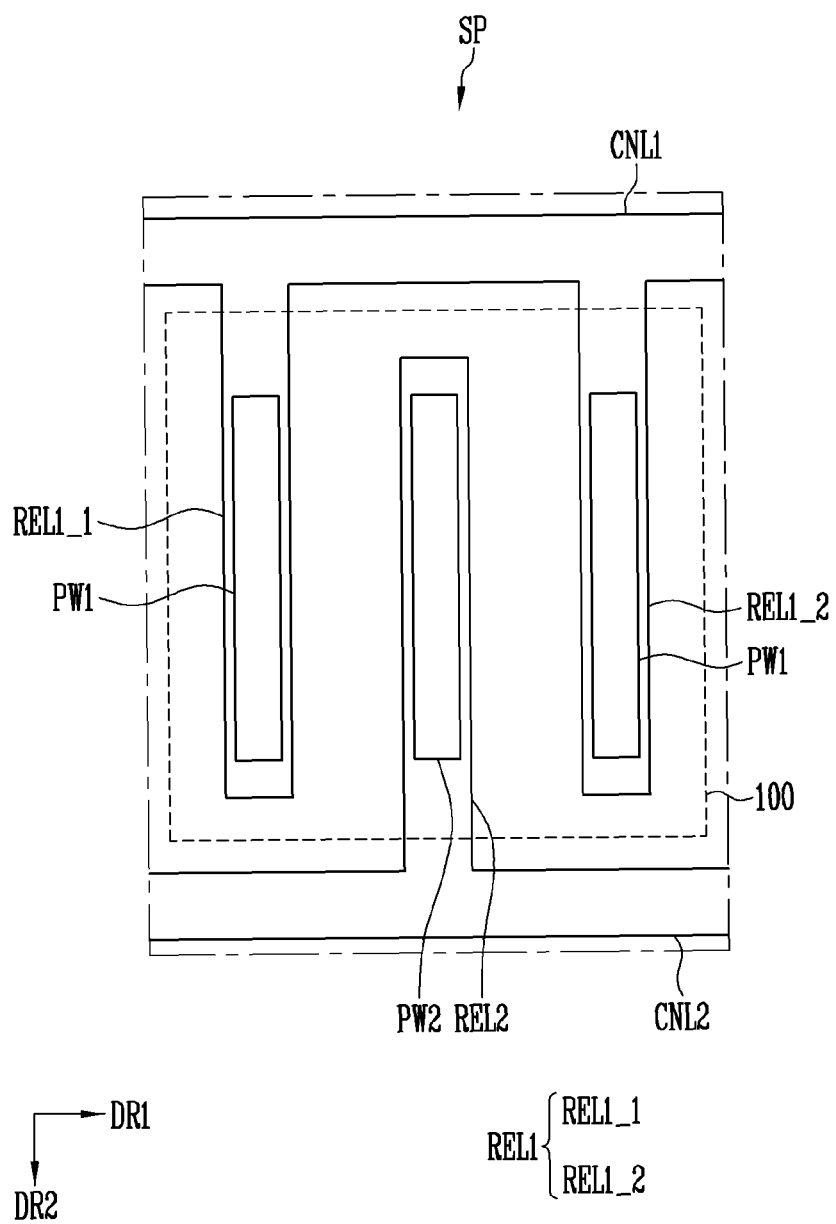
Figure 5D:
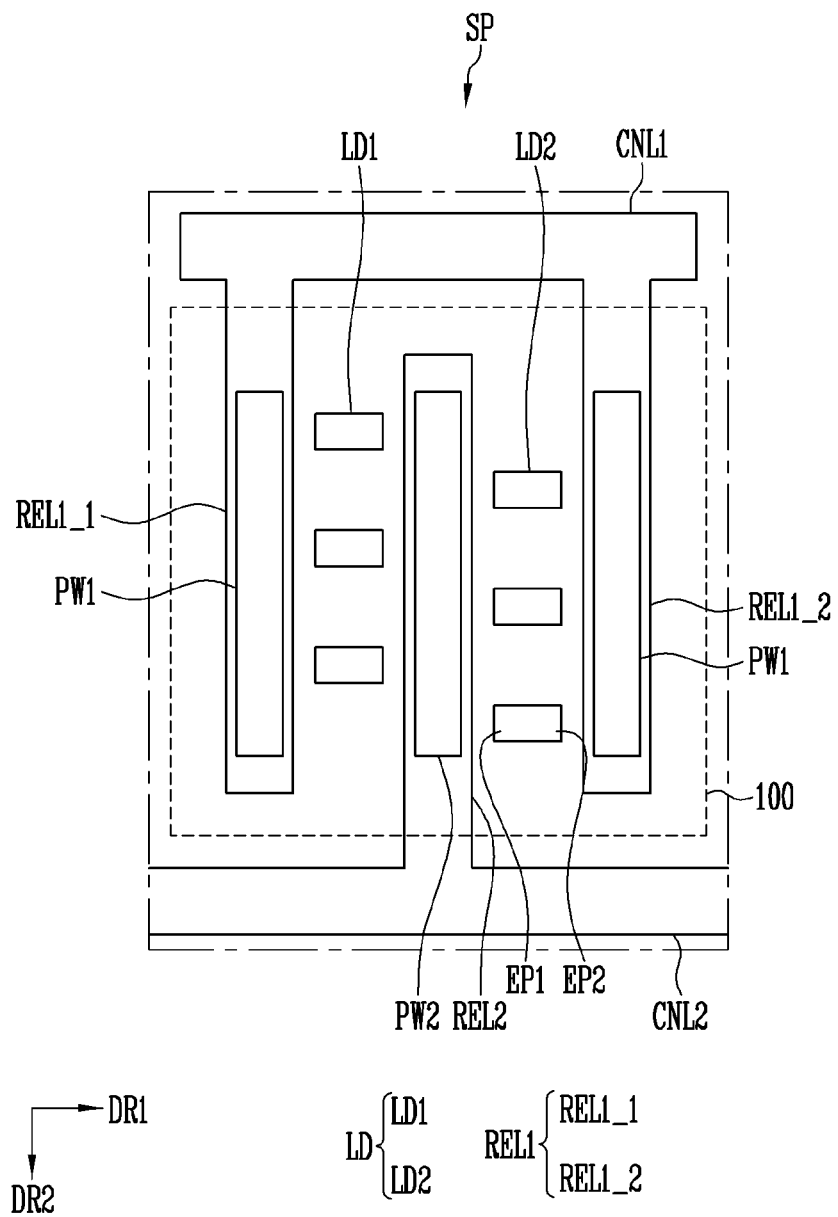
Figure 5E:
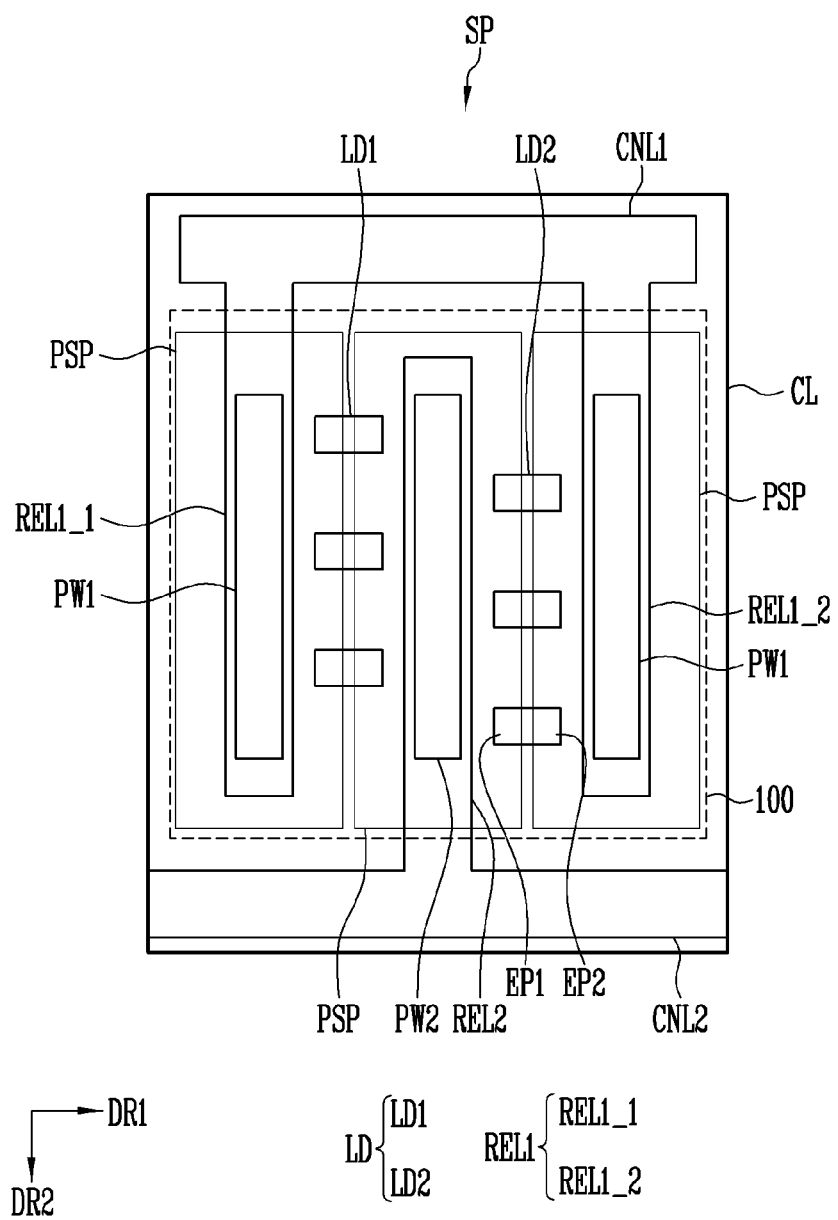
Figure 5F:
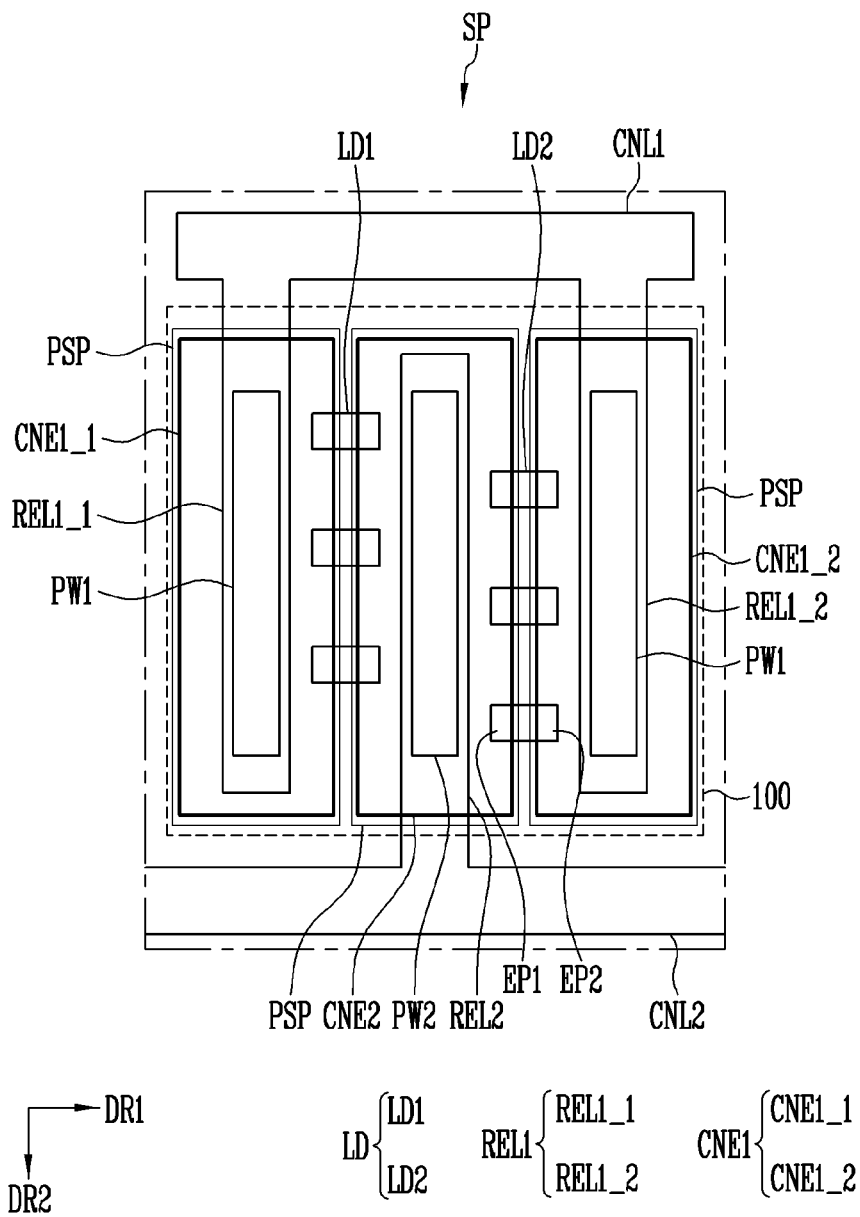
Figure 6A:
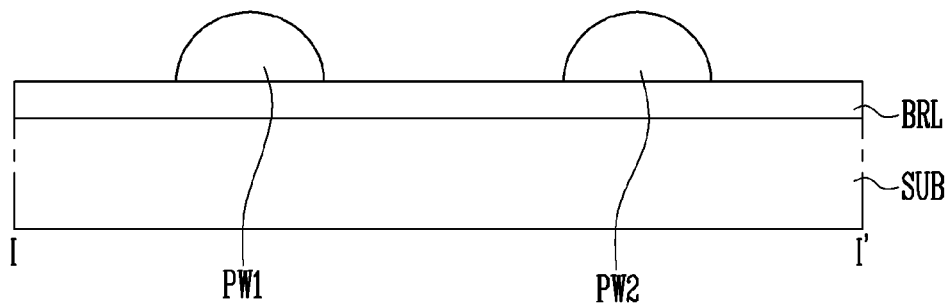
FIGS. 6A to 6K are schematic sectional diagrams sequentially illustrating a method of fabricating the light emitting device of FIG. 3.
Figure 6B:
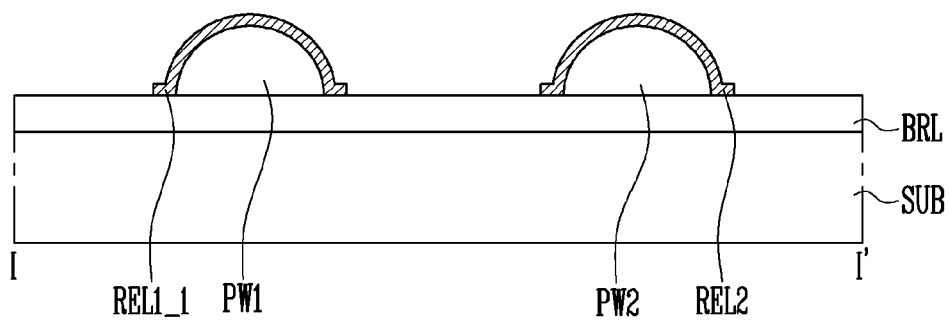
Figure 6C:
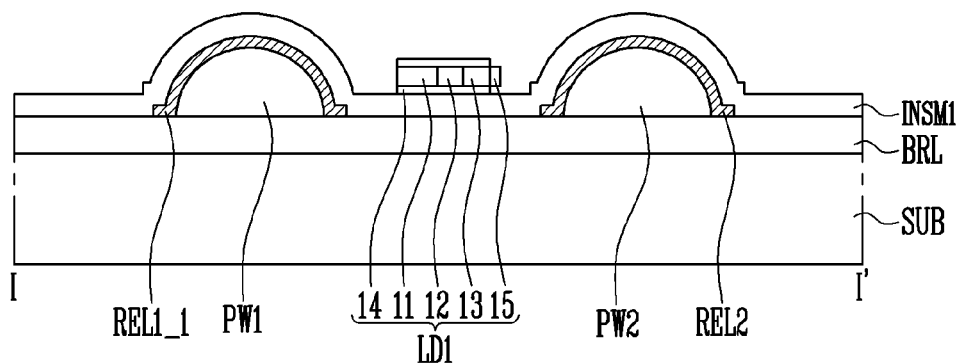
Figure 6D:
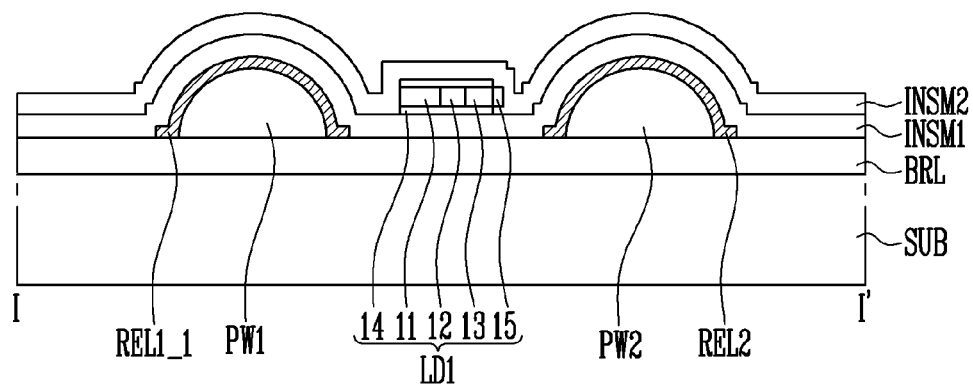
Figure 6E:
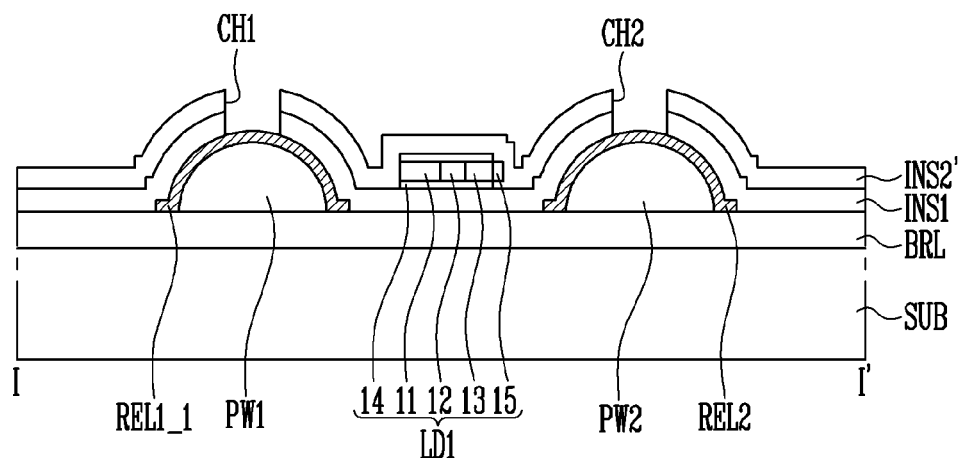
Figure 6F:
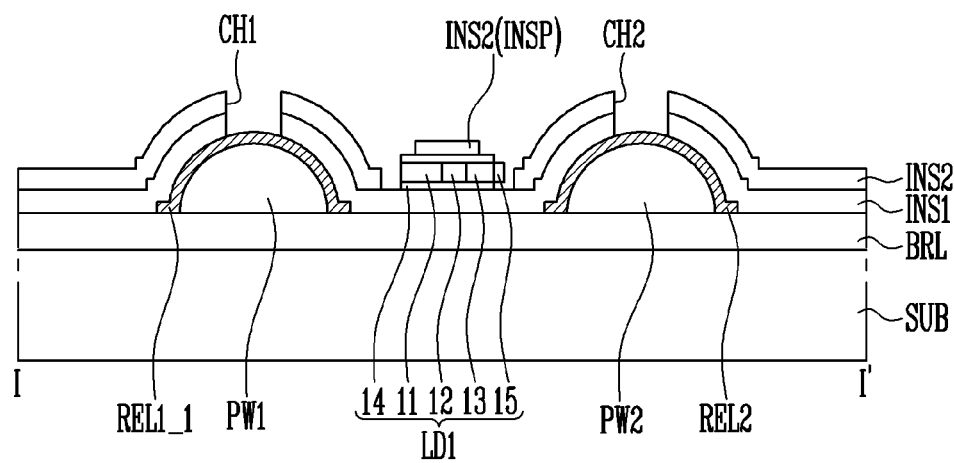
Figure 6G:
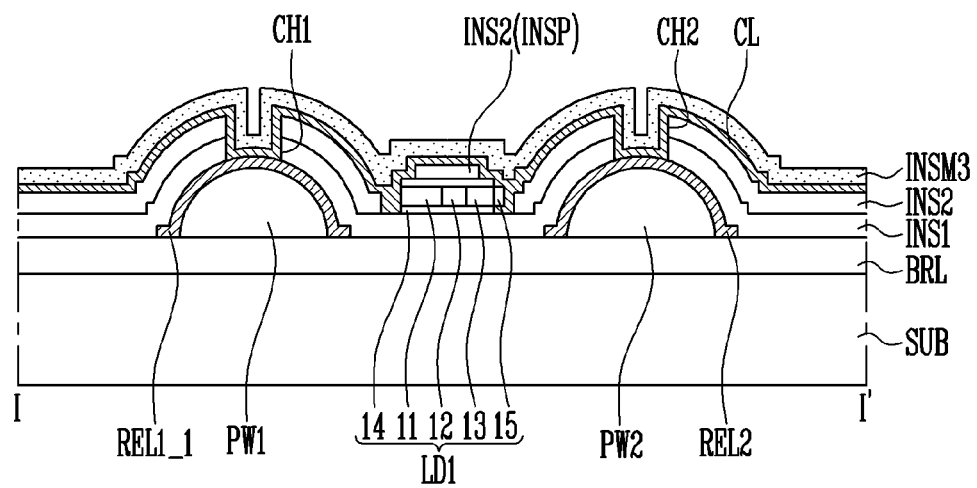
Figure 6H:
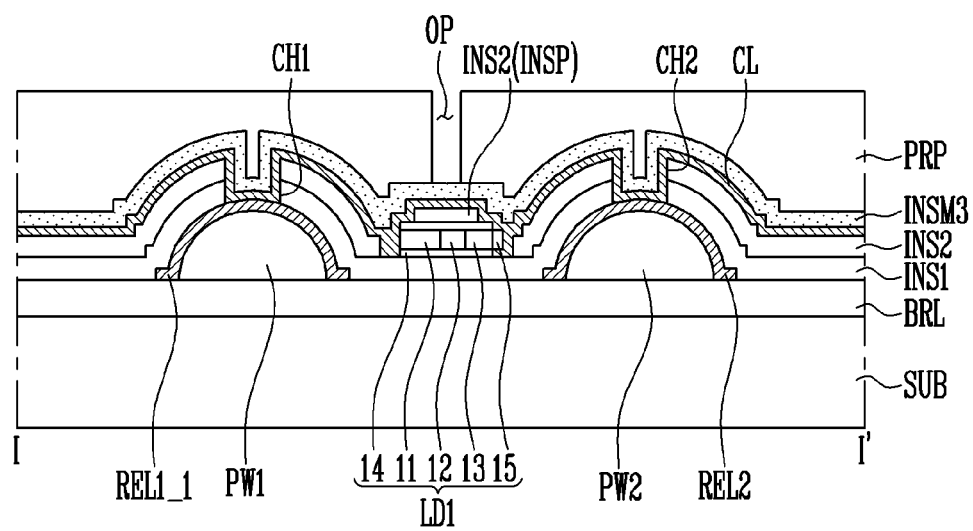
Figure 6I:
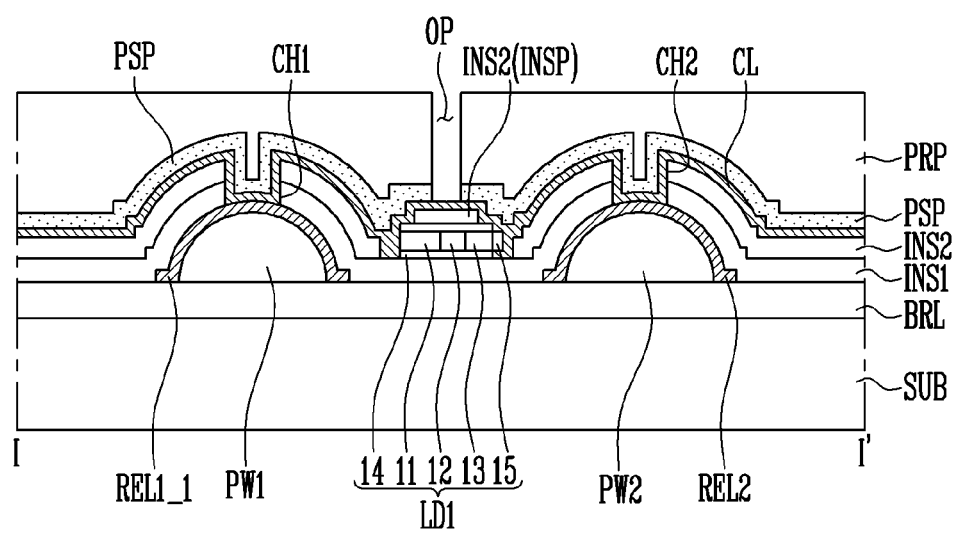
Figure 6J:
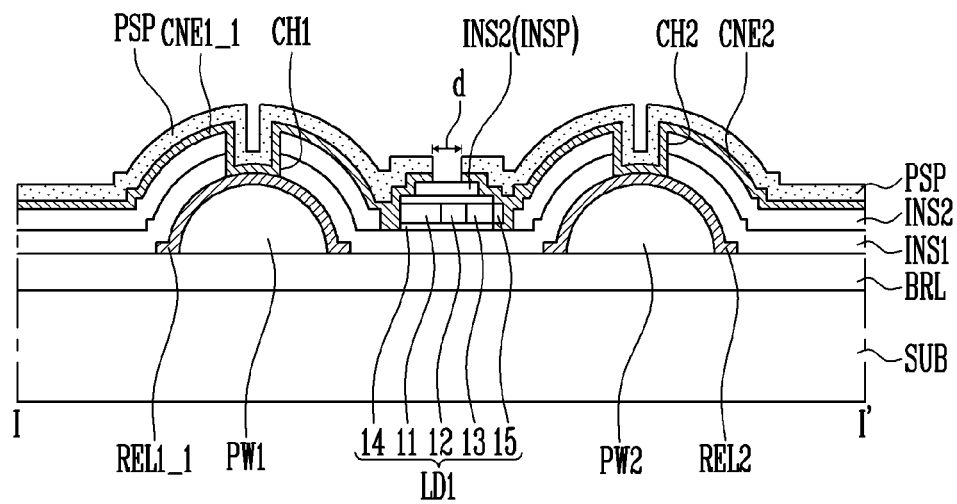
Figure 6K:
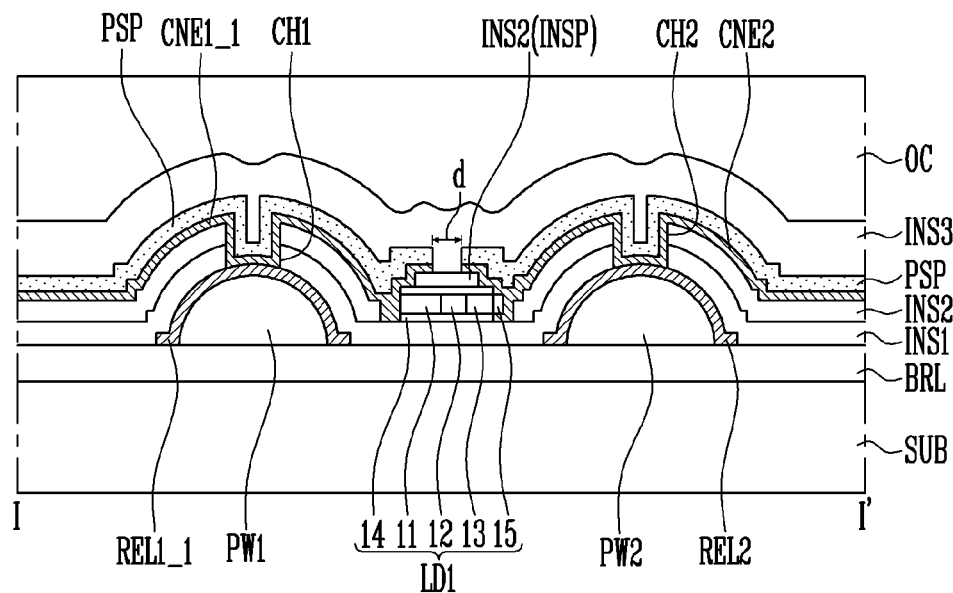

After the alignment of the light emitting elements LD has been completed, as illustrated in FIG. 5*d*, the first connection line CNL1 is divided between the sub-pixels adjacent to the one sub-pixel SP in the first direction DR1 so that the one sub-pixel SP and the sub-pixels adjacent thereto can be independently driven.

Referring to FIGS. 1A, 2A, 3, and 6A to 6D, a second insulating material layer INSM2 is formed on the first insulating material layer INSM1 on which the light emitting elements LD are aligned.

The second insulating material layer INSM2 may be formed of an inorganic insulating layer including inorganic material, or an organic insulating layer including organic material. Furthermore, the second insulating material layer INSM2 may have a single-layer structure, and may also have a multi-layer structure. In the case where the second insulating material layer INSM2 has a multi-layer structure, the second insulating material layer INSM2 may have a structure in which inorganic insulating layers and organic insulating layers are sequentially stacked.

Referring to FIGS. 1A, 2A, 3, and 6A to 6E, a first insulating layer INS1 and an insulating material pattern INS2' including a first contact hole CH1 which exposes a portion of the first electrode REL1 and a second contact hole CH2 which exposes a portion of the second electrode REL2 may be formed by patterning the first and second insulating material layers INSM1 and INSM2 using a mask.

Referring to FIGS. 1A, 2A, 3, and 6A to 6F, a second insulating layer INS2 including openings which expose the opposite ends EP1 and EP2 of each of the light emitting elements LD may be formed by patterning the insulating material pattern INS2' using a mask.

The second insulating layer INS2 may also be provided on a portion of the upper surface of each of the light emitting elements LD. Hereinafter, for the sake of convenience, the second insulating layer INS2 formed on the portion of the upper surface of each of the light emitting elements LD will be referred to as an insulating pattern INSP.

Referring to FIGS. 1A, 2A, 3, and 6A to 6G, a second conductive layer CL and a third insulating material layer INSM3 are sequentially formed on the second insulating layer INS2 and the insulating pattern INSP.

The second conductive layer CL may include transparent conductive material such as IZO. The IZO can be deposited at the room temperature without the need of performing a high-temperature process before or after the deposition, and may have material characteristics of low electrical resistance and high permeability. The third insulating material layer INSM3 may include an inorganic insulating layer formed of inorganic material, e.g., silicon nitride.

If the third insulating material layer INSM3 including the silicon nitride is formed on the second conductive layer CL formed of the IZO, the adhesive force between the second conductive layer CL and the third insulating material layer INSM3 may be increased by the material characteristics of the IZO and the silicon nitride. Consequently, satisfactory interface characteristics between the second conductive layer CL and the third insulating material layer INSM3 may be obtained.

Referring to FIGS. 1A, 2A, 3, and 6A to 6H, after a photoresist layer (not illustrated) is formed on the third insulating material layer INSM3, a photoresist pattern PRP including an opening OP which exposes a portion of the third insulating material layer INSM3 is formed by patterning the photoresist layer using a mask. The photoresist layer may include positive or negative photosensitive organic material.

The opening OP of the photoresist pattern PRP may correspond to a portion of the upper surface of the insulating pattern INSP.

Referring to FIGS. 1A, 2A, 3, 5E, and 6A to 6I, an area of the third insulating material layer INSM3 that corresponds to the opening OP of the photoresist pattern PRP may be removed by selectively etching the third insulating material layer INSM3 using the photoresist pattern PRP as a mask, whereby a passivation pattern PSP that allows the second conductive layer CL to be exposed may be formed.

The exposed area of the second conductive layer CL may correspond to the portion of the upper surface of the insulating pattern INSP.

Referring to FIGS. 1A, 2A, 3, 5F, and 6A to 6J, a first contact electrode CNE1 and a second contact electrode CNE2 which are electrically separated from each other are formed by selectively etching the exposed second conductive layer CL using the passivation pattern PSP as a mask.

A method of selectively etching the second conductive layer CL may include, e.g., a wet etching method. The wet etching method may refer to an etching process of oxidizing a surface of a target by applying an etchant to the surface of the target.

In an embodiment of the disclosure, a solvent capable of etching the second conductive layer CL disposed under the passivation pattern PSP may be used as the etchant.

If the wet etching process is performed, the exposed area of the second conductive layer CL may be removed by the etchant, so that the portion of the upper surface of the insulating pattern INSP may be exposed. Consequently, the first contact electrode CNE1 and the second contact electrode CNE2, which are spaced apart from each other by a predetermined distance d on the portion of the upper surface of the insulating pattern INSP and are electrically separated from each other, may be formed.

In an embodiment of the disclosure, the first contact electrode CNE1 may be provided on the first electrode REL1 and one of the opposite ends EP1 and EP2 of each of the light emitting elements LD.

The first contact electrode CNE1 may be electrically connected to the first electrode REL1 through the first contact hole CH1 of the first and second insulating layers INS1 and INS2. The first contact electrode CNE1 may be electrically connected to one end of each of the light emitting elements LD. Therefore, the first electrode REL1 and each of the light emitting elements LD may be electrically connected with each other through the first contact electrode CNE1.

The second contact electrode CNE2 may be provided on the second electrode REL2 and the other one of the opposite ends EP1 and EP2 of each of the light emitting elements LD.

The second contact electrode CNE2 may be electrically connected to the second electrode REL2 through the second contact hole CH2 of the first and second insulating layers INS1 and INS2. The second contact electrode CNE2 may be electrically connected to the other end of each of the light emitting elements LD. Therefore, the second electrode REL2 and each of the light emitting elements LD may be electrically connected with each other through the second contact electrode CNE2.

After the first and second contact electrodes CNE1 and CNE2 are formed on the substrate SUB, the photoresist pattern PRP is removed.

When the wet etching process is performed, the etchant may not penetrate into the second conductive layer CL that is covered with the passivation pattern PSP. The reason for this is because the adhesive force between the passivation pattern PSP and the second conductive layer CL is enhanced thanks to material characteristics of each of the passivation pattern PSP and the second conductive layer CL and thus a gap is not formed in the interface between the passivation pattern PSP and the second conductive layer CL. Therefore, the etchant does not penetrate into the second conductive layer CL disposed under the passivation pattern PSP, so that the second conductive layer CL can be prevented from undesirably short-circuiting. Consequently, defects in fabricating the first and second contact electrodes CNE1 and CNE2 may be reduced.

Referring to FIGS. 1A, 2A, 3, and 6A to 6K, a third insulating layer INS3 is formed on the passivation pattern PSP and the exposed portion of the upper surface of the insulating pattern INSP.

The third insulating layer INS3 may be formed of an inorganic insulating layer including inorganic material, or an organic insulating layer including organic material. Although the third insulating layer INS3 may have a single layer structure as shown in the drawing, the disclosure is not limited thereto. For example, the third insulating layer INS3 may have a multi-layer structure.

Subsequently, the overcoat layer OC is formed on the third insulating layer INS3.

Figure 7:
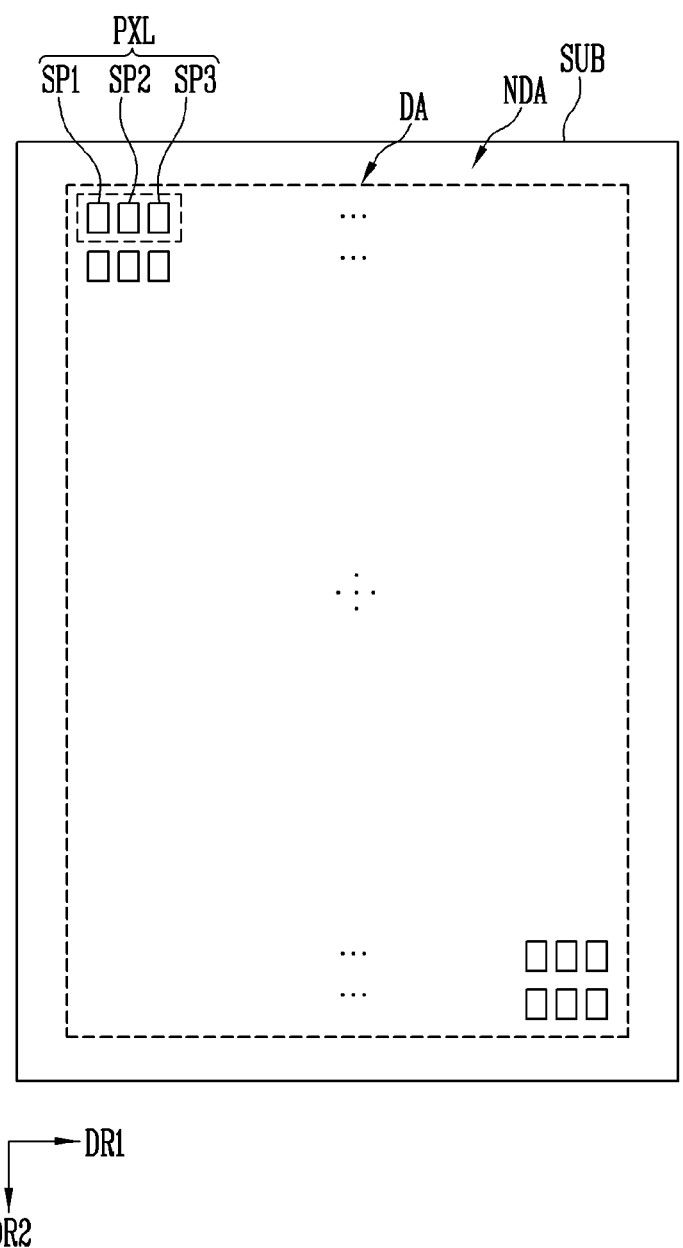
FIG. 7 schematically illustrates a display device in accordance with an embodiment of the disclosure and is a schematic plan diagram illustrating a display device using the light emitting element illustrated in FIG. 1A as a light emitting source.

FIG. 7 schematically illustrates a display device in accordance with an embodiment of the disclosure, and specifically, is a schematic plan diagram illustrating a display device using the light emitting element illustrated in FIG. 1A as a light emitting source.

For the sake of explanation, FIG. 7 schematically illustrates the structure of the display device, focused on a display area in which an image is displayed. In some embodiments, although not illustrated, at least one driving circuit (e.g., a scan driver and a data driver) and/or a plurality of lines may be further provided in the display device.

Referring to FIGS. 1A and 7, the display device in accordance with the embodiment of the disclosure may include a substrate SUB, pixels PXL provided on the substrate SUB and each including at least one light emitting element LD, a driver (not illustrated) provided on the substrate SUB and configured to drive the pixels PXL, and a line component (not illustrated) provided to electrically connect the pixels PXL with the driver.

The display device may be classified into a passive-matrix type display device and an active-matrix type display device according to a method of driving the light emitting element LD. For example, in the case where the display device is implemented as an active-matrix type, each of the pixels PXL may include a driving transistor configured to control the amount of current to be supplied to the light emitting element LD, and a switching transistor configured to transmit data signals to the driving transistor.

Recently, active-matrix type display devices capable of selectively turning on each pixel PXL taking into account the resolution, the contrast, and the working speed have been mainstreamed. However, the disclosure is not limited thereto. For example, passive-matrix type display devices in which a group of pixels PXL may be turned on may also employ components (e.g., first and second electrodes) for driving the light emitting element LD.

The substrate SUB may include a display area DA and a non-display area NDA.

In an embodiment, the display area DA may be disposed in a central portion of the display device, and the non-display area NDA may be disposed in a perimeter portion of the display device in such a way as to enclose the display area DA. The locations of the display area DA and the non-display area NDA are not limited to this, and the locations thereof may vary.

The display area DA may be an area in which the pixels PXL for displaying an image are provided. The non-display area NDA may be an area in which the driver for driving the pixels PXL and some of the line component for coupling the pixels PXL to the driver are provided.

The display area DA may have various shapes. For example, the display area DA may be provided in various shapes such as a closed polygon including sides formed of linear lines; a circle, an ellipse, or the like including a side formed of a curved line; and a semicircle, a semi-ellipse, or the like including sides formed of a linear line and a curved line.

The non-display area NDA may be provided on at least one side of the display area DA. In an embodiment of the disclosure, the non-display area NDA may enclose the periphery of the display area DA.

The pixels PXL may be provided in the display area DA on the substrate SUB. Each of the pixels PXL refers to a smallest unit for displaying the image, and multiple pixels may be provided.

Each of the pixels PXL may include the light emitting element LD configured to be driven in response to a corresponding scan signal and a corresponding data signal. The light emitting element LD may have a small size corresponding to a nano scale or a micro scale, and be electrically connected in parallel to light emitting elements disposed adjacent thereto. The light emitting element LD may form a light source of the corresponding pixel PXL.

The pixels PXL may be arranged in a matrix form along rows extending in a first direction DR1 and columns extending in a second direction DR2 intersecting the first direction DR1. However, the arrangement of the pixels PXL is not limited to a particular arrangement. In other words, the pixels PXL may be arranged in various forms.

The driver may provide a signal to each pixel PXL through the line component and may control the operation of the pixel PXL. In FIG. 7, for the sake of explanation, the line component is omitted.

The driver may include a scan driver configured to provide a scan signal to the pixels PXL through a scan line, an emission driver configured to provide an emission control signal to the pixels PXL through an emission control line, a data driver configured to provide a data signal to the pixels PXL through a data line, and a timing controller. The timing controller may control the scan driver, the emission driver, and the data driver.

FIGS. 8A to 8D are circuit diagrams illustrating examples of a first sub-pixel of first to third sub-pixels of the display device of FIG. 7 in accordance with various embodiments.

Referring to FIGS. 8A to 8D, each of the first to third sub-pixels may be configured of an active pixel. However, the type, the structure, and/or the driving method of each of the first to third sub-pixels is not particularly limited. For example, each of the first to third sub-pixels may be configured of a pixel of a passive or active display device which can have various known structures.

Referring to FIGS. 8A to 8D, the first to third sub-pixels may have substantially the same structure or similar structure(s). Hereinafter, for the sake of convenience, the first sub-pixel of the first to third sub-pixels will be described as a representative example.

Figure 8A:
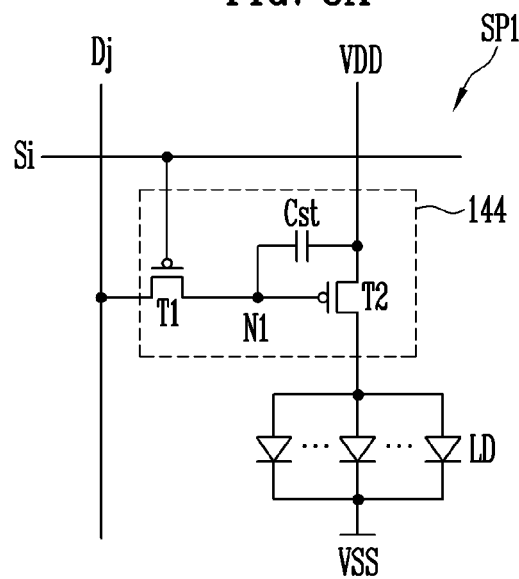
FIGS. 8A to 8D are schematic circuit diagrams illustrating examples of a first sub-pixel of first to third sub-pixels of the display device of FIG. 7 in accordance with various embodiments.

Referring to FIGS. 1A, 7, and 8A, the first sub-pixel SP1 may include light emitting elements LD electrically connected in parallel to each other between a first driving power supply VDD and a second driving power supply (or referred to as second driving power) VSS, and a pixel driving circuit 144 configured to drive the light emitting elements LD.

Each of the light emitting elements LD may include a first electrode (e.g., an anode electrode) electrically connected to a first driving power supply VDD via the pixel driving circuit 144, and a second electrode (e.g., a cathode electrode) electrically connected to a second driving power supply VSS.

The first driving power supply VDD and the second driving power supply VS S may have different potentials. For example, the second driving power supply VSS may have a potential lower than that of the first driving power supply VDD by a value equal to or greater than a threshold voltage of the light emitting elements LD.

Each of the light emitting elements LD may emit light at a luminance corresponding to driving current that is controlled by the pixel driving circuit 144.

Although FIGS. 8A to 8D illustrate embodiments in which the light emitting elements LD are electrically connected in parallel to each other in the same direction (e.g., a forward direction) between the first and second driving power supplies VDD and VSS, the disclosure is not limited thereto. For example, in an embodiment, some of the light emitting elements LD may be electrically connected in forward direction between the first and second driving power supplies VDD and VSS, and the other light emitting elements LD may be electrically connected in a reverse direction. One of the first and second driving power supplies VDD and VSS may be supplied in the form of alternating voltage. In this case, groups of the light emitting elements LD connected in an identical direction may alternately emit light. In an embodiment, the first sub-pixel SP1 may include a single light emitting element LD.

In an embodiment of the disclosure, the pixel driving circuit 144 may include first and second transistors T1 and T2, and a storage capacitor Cst. However, the structure of the pixel driving circuit 144 is not limited to the embodiment illustrated in FIG. 8A.

The first transistor T1 (switching transistor) includes a first electrode electrically connected to a data line Dj, and a second electrode electrically connected to a first node N1. Here, the first electrode and the second electrode of the first transistor T1 may be different electrodes. For example, if the first electrode is a source electrode, the second electrode is a drain electrode. The first transistor T1 may include a gate electrode electrically connected to the scan line Si.

When a scan signal having a voltage (e.g., a low-level voltage) capable of turning on the first transistor T1 is supplied from the scan line Si, the first transistor T1 is turned on to electrically connect the data line Dj with the first node N1. Here, a data signal of a corresponding frame is supplied to the data line Dj, whereby the data signal is transmitted to the first node N1. The storage capacitor Cst is charged by the data signal transmitted to the first node N1.

The second transistor T2 (driving transistor) may include a first electrode electrically connected to the first driving power supply VDD, and a second electrode electrically connected to the first electrode of each of the light emitting elements LD. The second transistor T2 may include a gate electrode electrically connected to the first node N1. The second transistor T2 may control the amount of driving current to be supplied to the light emitting elements LD in response to the voltage of the first node N1.

One electrode of the storage capacitor Cst is electrically connected to the first driving power supply VDD, and the other electrode thereof is electrically connected to the first node N1. The storage capacitor Cst may charge a voltage corresponding to the data signal supplied to the first node N1, and maintain the charged voltage until a data signal of a subsequent frame is supplied.

For the sake of explanation, FIG. 8A illustrates the pixel driving circuit 144 having a relatively simple structure including the first transistor T1 configured to transmit the data signal to the first sub-pixel SP1, the storage capacitor Cst configured to store the data signal, and the second transistor T2 configured to supply driving current corresponding to the data signal to the light emitting elements LD.

However, the disclosure is not limited to the foregoing structure, and the structure of the pixel driving circuit 144 may vary. For example, the pixel driving circuit 144 may further include at least one transistor element such as a transistor element configured to compensate for the threshold voltage of the second transistor T2, a transistor element configured to initialize the first node N1, and/or a transistor element configured to control an emission time of the light emitting element LD, or other circuit elements such as a boosting capacitor for boosting the voltage of the first node N1.

Although the transistors, e.g., the first and second transistors T1 and T2, included in the pixel driving circuit 144 have been illustrated as being P-type transistors in FIG. 8A, the disclosure is not limited to this. In other words, at least one of the first and second transistors T1 and T2 included in the pixel driving circuit 144 may be an N-type transistor.

Figure 8B:
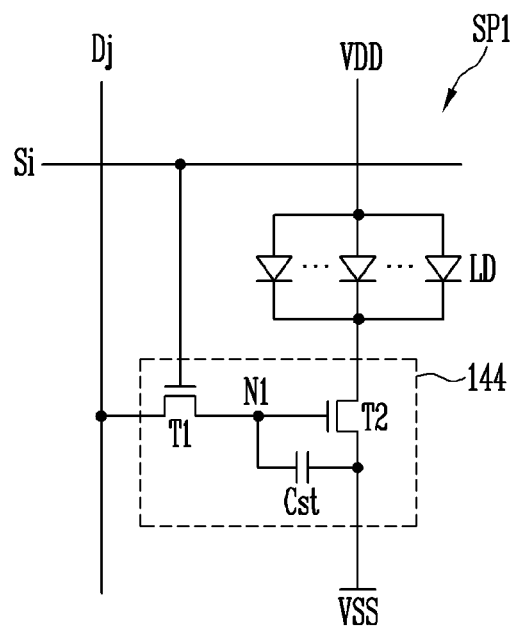

Referring to FIGS. 1A, 7, and 8B, the first and second transistors T1 and T2 in accordance with an embodiment of the disclosure may be N-type transistors. The configuration and operation of the pixel driving circuit 144 illustrated in FIG. 8B, other than a change in connection positions of some components due to a change in the type of transistor, are similar to those of the pixel driving circuit 144 of FIG. 8A. Therefore, detailed descriptions pertaining to this will be omitted.

Figure 8C:
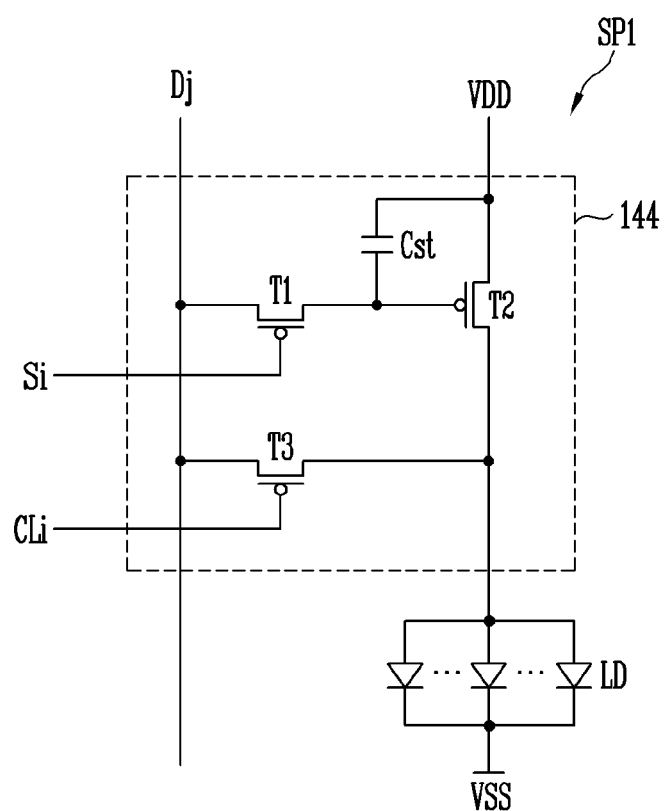

In an embodiment, as illustrated in FIG. 8C, the pixel driving circuit 144 may further include a third transistor T3 as well as the first and second transistors T1 and T2.

The third transistor T3 may include a gate electrode electrically connected to a control line CLi, and a second electrode electrically connected to the first electrode of each of the light emitting elements LD. The first electrode of the third transistor T3 is electrically connected to the data line Dj. The third transistor T3 may be turned on in case that a control signal is supplied to the control line CLi, and may be turned off in the other cases. Although the transistors, e.g., the first to third transistors T1 to T3, included in the pixel driving circuit 144 have been illustrated as being P-type transistors in FIG. 8C, the disclosure is not limited to this. For example, at least one of the first to third transistors T1 to T3 included in the pixel driving circuit 144 may be an N-type transistor. As another example, all of the first to third transistors T1 to T3 included in the pixel driving circuit 144 may be N-type transistors.

In an embodiment of the disclosure, the configuration of the pixel driving circuit 144 is not limited to the embodiments illustrated in FIGS. 8A to 8C. For example, the pixel driving circuit 144 may be configured in the same manner as that of an embodiment illustrated in FIG. 8D.

Figure 8D:
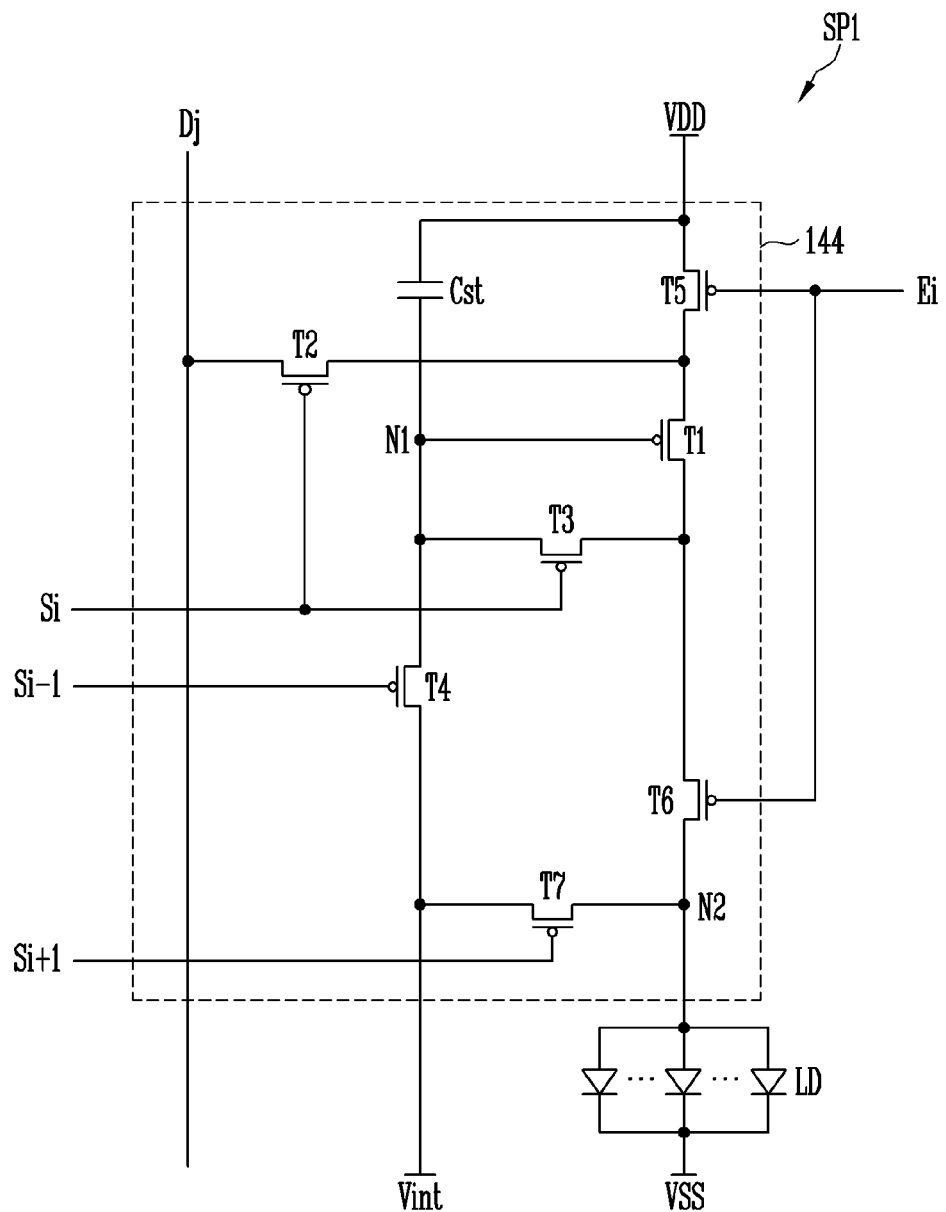

Referring to FIGS. 1A, 7, and 8D, the pixel driving circuit 144 may be electrically connected to the scan line Si and the data line Dj of the first sub-pixel SP1. For example, if the first sub-pixel SP1 is disposed on an i-th row and a j-th column of the display area DA, the pixel driving circuit 144 of the first sub-pixel SP1 may be electrically connected to an i-th scan line Si and a j-th data line Dj of the display area DA.

In an embodiment, the pixel driving circuit 144 may be further connected to at least one scan line. For example, the first sub-pixel SP1 disposed on the i-th row of the display area DA may be further electrically connected to an i−1-th scan line Si−1 and/or an i+1-th scan line Si+1.

In an embodiment, the pixel driving circuit 144 may be electrically connected not only to the first and second driving power supplies VDD and VSS but also to a third power supply. For example, the pixel driving circuit 144 may also be electrically connected to an initialization power supply Vint.

Here, the pixel driving circuit 144 may include first to seventh transistors T1 to T7, and a storage capacitor Cst.

The first transistor T1 (driving transistor) may include a first electrode, e.g., a source electrode, electrically connected to the first driving power supply VDD via the fifth transistor T5, and a second electrode, e.g., a drain electrode, electrically connected to one ends of light emitting elements LD via the sixth transistor T6. The first transistor T1 may include a gate electrode electrically connected to a first node N1. The first transistor T1 may control driving current flowing between the first driving power supply VDD and the second driving power supply VSS via the light emitting elements LD in response to the voltage of the first node N1.

The second transistor T2 (switching transistor) may be connected between the j-th data line Dj electrically connected to the first sub-pixel SP1 and the source electrode of the first transistor T1. A gate electrode of the second transistor T2 is electrically connected to the i-th scan line Si electrically connected to the first sub-pixel SP1. In case that a scan signal having a gate-on voltage (e.g., a low-level voltage) is supplied from the i-th scan line Si, the second transistor T2 is turned on to electrically connect the j-th data line Dj to the source electrode of the first transistor T1. Hence, if the second transistor T2 is turned on, a data signal supplied from the j-th data line Dj may be transmitted to the first transistor T1.

The third transistor T3 is connected between the drain electrode of the first transistor T1 and the first node N1. The third transistor T3 may include a gate electrode electrically connected to the i-th scan line Si. In case that a scan signal having a gate-on voltage is supplied from the i-th scan line Si, the third transistor T3 may be turned on to electrically connect the drain electrode of the first transistor T1 to the first node N1. Therefore, in case that the third transistor T3 is turned on, the first transistor T1 may be diode-connected.

The fourth transistor T4 is connected between the first node N1 and the initialization power supply Vint. A gate electrode of the fourth transistor T4 is electrically connected to a preceding scan line, e.g., an i−1-th scan line Si−1. In case that a scan signal of a gate-on voltage is supplied to the i−1-th scan line Si−1, the fourth transistor T4 may be turned on so that the voltage of the initialization power supply Vint may be transmitted to the first node N1. Here, the initialization power supply Vint may have a voltage equal to or less than the minimum voltage of the data signal.

The fifth transistor T5 is connected between the first driving power supply VDD and the first transistor T1. A gate electrode of the fifth transistor T5 may be electrically connected to a corresponding emission control line, e.g., an i-th emission control line Ei. The fifth transistor T5 may be turned off in case that an emission control signal having a gate-off voltage is supplied to the i-th emission control line Ei, and may be turned on in other cases.

The sixth transistor T6 is connected between the first transistor T1 and a second node N2, which is electrically connected to one end of each of the light emitting elements LD. A gate electrode of the sixth transistor T6 is electrically connected to the i-th emission control line Ei. The sixth transistor T6 may be turned off in case that an emission control signal having a gate-off voltage is supplied to the i-th emission control line Ei, and may be turned on in other cases.

The seventh transistor T7 is connected between the second node N2, which is electrically connected to the first ends of the light emitting elements LD, and the initialization power supply Vint. A gate electrode of the seventh transistor T7 is electrically connected to any one of scan lines of a subsequent stage, e.g., to the i+1-th scan line Si+1. In case that a scan signal of a gate-on voltage is supplied to the i+1-th scan line Si+1, the seventh transistor T7 may be turned on so that the voltage of the initialization power supply Vint may be supplied to the first ends of the light emitting elements LD.

The storage capacitor Cst may be connected between the first driving power supply VDD and the first node N1. The storage capacitor Cst may store a voltage corresponding to the threshold voltage of the first transistor T1 and/or the data signal applied to the first node N1 during each frame period.

For the sake of convenience, FIG. 8D illustrates that all of the first to seventh transistors T1 to T7 are P-type transistors, but the disclosure is not limited thereto. For example, at least one of the first to seventh transistors T1 to T7 included in the pixel driving circuit 144 may be an N-type transistor, or all of the first to seventh transistors T1 to T7 may be N-type transistors.

Figure 9:
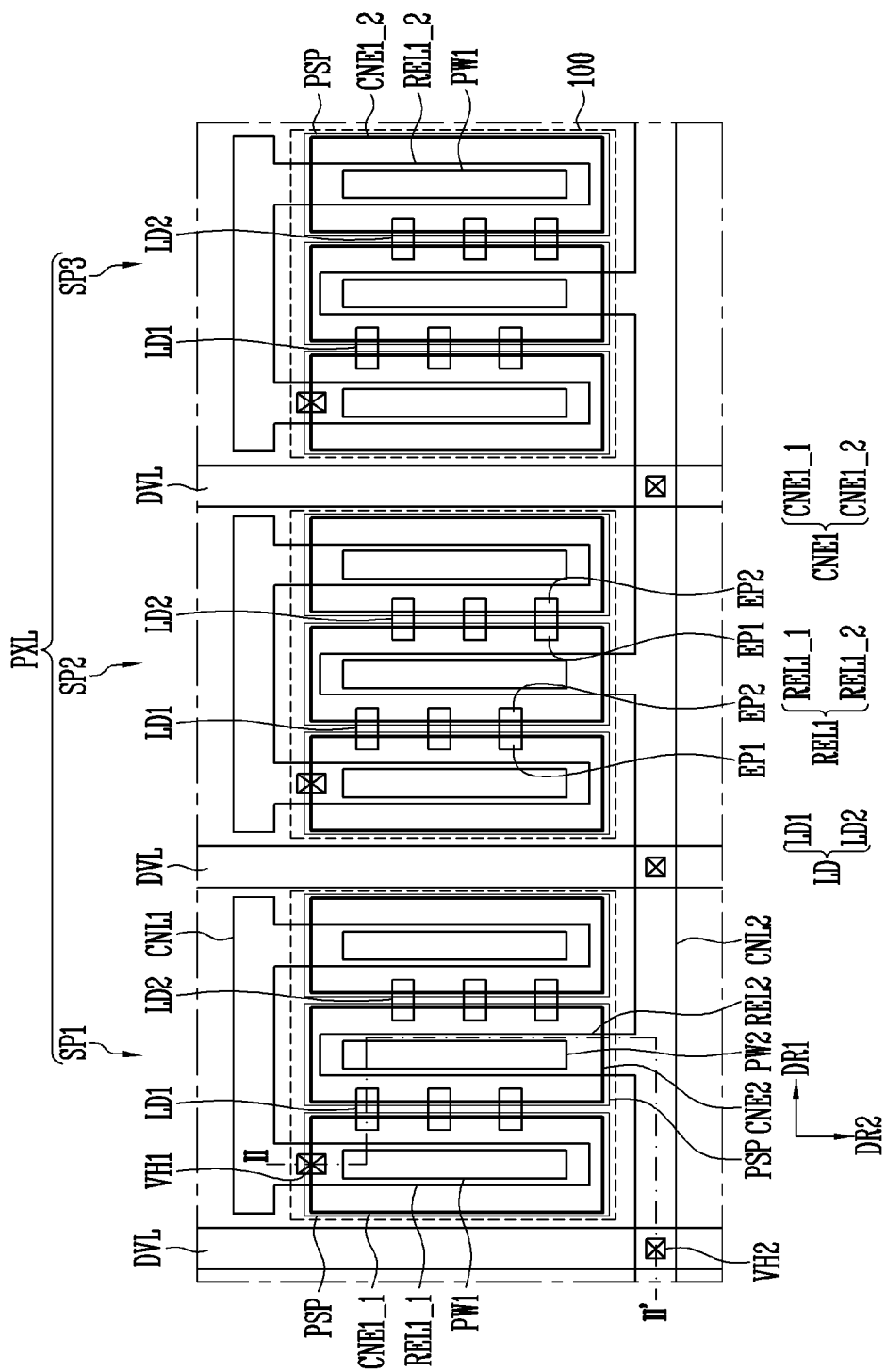
FIG. 9 is a plan diagram schematically illustrating first to third sub-pixels included in one of pixels illustrated in FIG. 7.
Figure 10:
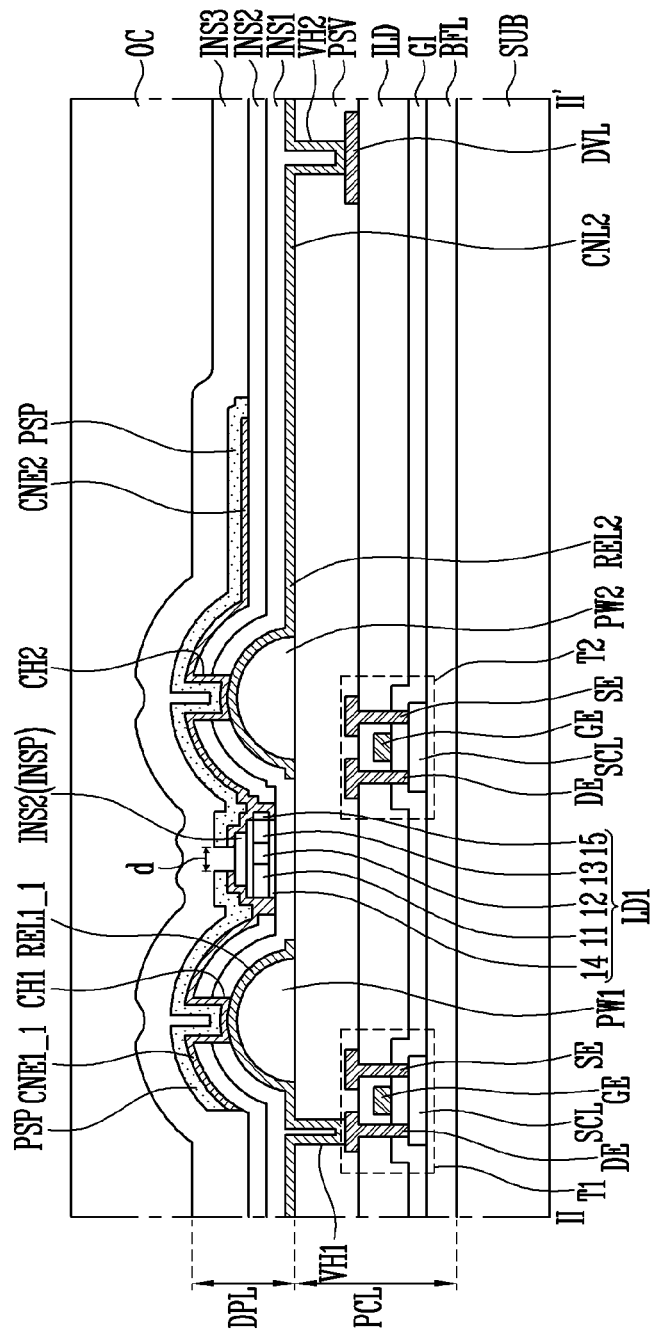
FIG. 10 is a schematic sectional diagram taken along line II-IF of FIG. 9.
Figure 11:
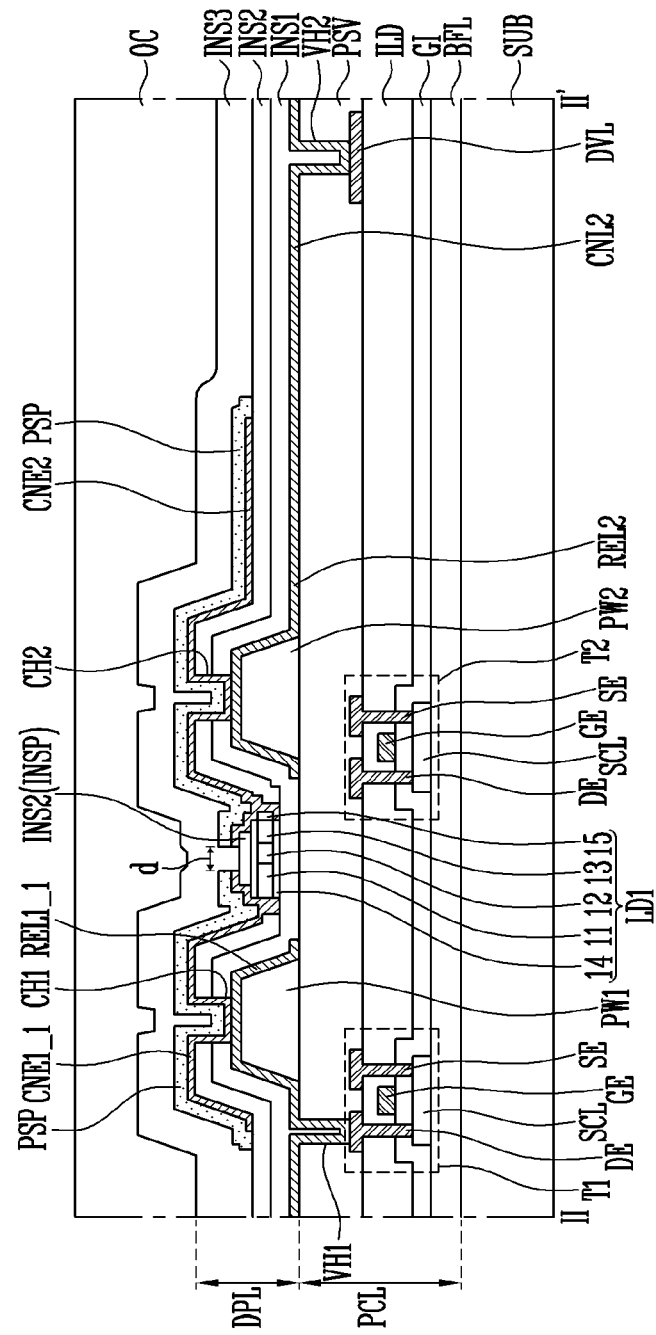
FIG. 11 schematically illustrates a display device in accordance with an embodiment of the disclosure, and is a schematic sectional diagram corresponding to line II-IF of FIG. 9.

FIG. 9 is a plan diagram schematically illustrating first to third sub-pixels included in one of pixels illustrated in FIG. 7. FIG. 10 is a schematic sectional diagram taken along line II-IF of FIG. 9. FIG. 11 illustrates a display device in accordance with an embodiment of the disclosure, and is a schematic sectional diagram corresponding to line II-IF of FIG. 9.

In an embodiment of the disclosure, the following description will be focused on differences from the foregoing embodiments to avoid repetitive explanation. Components which are not separately explained in the following description of the embodiment comply with that of the foregoing embodiments. The same reference numeral will be used to designate the same component, and a similar reference numeral will be used to designate a similar component.

In FIG. 9, for the sake of explanation, light emitting elements provided in each sub-pixel are illustrated as being horizontally arranged. However, the arrangement of the light emitting elements is not limited thereto. For example, at least some of the light emitting elements may be arranged in a direction intersecting the horizontal direction.

For the sake of explanation, illustration of transistors electrically connected to the light emitting elements, and signal lines electrically connected to the transistors has been omitted in FIG. 9.

Moreover, although FIGS. 9 to 11 schematically illustrate a simplified structure of the one pixel, e.g., by showing that each electrode has only a single electrode layer, the disclosure is not limited thereto.

Referring to FIGS. 1A to 11, the display device in accordance with an embodiment of the disclosure may include a substrate SUB on which pixels PXL are provided. Each of the pixels PXL may include a first sub-pixel SP1, a second sub-pixel SP2, and a third sub-pixel SP3 which are provided on the substrate SUB.

The unit emission area 100 of each of the first to third sub-pixels SP1, SP2, and SP3 may include the substrate SUB, a pixel circuit layer PCL provided on the substrate SUB, and a display element layer DPL provided on the pixel circuit layer PCL.

In an embodiment of the disclosure, the unit emission area 100 may include a pixel area of a corresponding sub-pixel. For example, the unit emission area 100 of the first sub-pixel SP1 may include a pixel area of the first sub-pixel SP1. The unit emission area 100 of the second sub-pixel SP2 may include a pixel area of the second sub-pixel SP2. The unit emission area 100 of the third sub-pixel SP3 may include a pixel area of the third sub-pixel SP3.

The pixel circuit layer PCL of each sub-pixel may include a buffer layer BFL disposed on the substrate SUB, first and second transistors T1 and T2 disposed on the buffer layer BFL, and a driving voltage line DVL. The pixel circuit layer PCL of each sub-pixel may further include a passivation layer PSV which is provided on the first and second transistors T1 and T2 and the driving voltage line DVL.

The display element layer DPL of each sub-pixel may include first and second partition walls PW1 and PW2, first and second electrodes REL1 and REL2, first and second connection lines CNL1 and CNL2, light emitting elements LD, and first and second contact electrodes CNE1 and CNE2 which are provided on the passivation layer PSV.

For the sake of convenience, the display element layer DPL of each sub-pixel will be described after the pixel circuit layer PCL of each sub-pixel is described.

The substrate SUB may include an insulating material such as glass, an organic polymer, or crystal. The substrate SUB may be made of material having flexibility so as to be bendable or foldable, and may have a single-layer or multi-layer structure.

The buffer layer BFL may be provided on the substrate SUB and may prevent impurities from diffusing into the first and second transistors T1 and T2. The buffer layer BF may be provided in a single-layer structure or a multi-layer structure having two or more layers. In the case where the buffer layer BFL has a multi-layer structure, the respective layers may be formed of the same material or different materials. The buffer layer BFL may be omitted depending on the material of the substrate SUB or processing conditions.

The first transistor T1 may be a driving transistor that is electrically connected to some of the light emitting elements LD provided in the display element layer DPL to drive the corresponding light emitting element LD. The second transistor T2 may be a switching transistor configured to switch the first transistor T1.

Each of the first and second transistors T1 and T2 may include a semiconductor layer SCL, a gate electrode GE, a source electrode SE, and a drain electrode DE.

The semiconductor layer SCL may be disposed on the buffer layer BFL. The semiconductor layer SCL may include a first area which comes into contact with the drain electrode DE, and a second area which comes into contact with the source electrode SE. An area between the first area and the second area may be a channel area. In an embodiment of the disclosure, the first area may be any one of a source area and a drain area, and the second area may be the other area.

The semiconductor layer SCL may be a semiconductor pattern formed of polysilicon, amorphous silicon, an oxide semiconductor, etc. The channel area may be an intrinsic semiconductor, which is an undoped semiconductor pattern. Each of the first area and the second area may be a semiconductor pattern doped with impurities.

The gate electrode GE may be provided on the semiconductor layer SCL with a gate insulating layer GI interposed therebetween.

The drain electrode DE and the source electrode SE may respectively come into contact with the first area and the second area of the semiconductor layer SCL through corresponding contact holes that pass through an interlayer insulating layer ILD and the gate insulating layer GI.

The driving voltage line DVL may be provided on the interlayer insulating layer ILD, but it is not limited thereto. In some embodiments, the driving voltage line DVL may be provided on any one of insulating layers included in the pixel circuit layer PCL. The second driving power VSS may be applied to the driving voltage line DVL.

The passivation layer PSV may include a first via hole VH1 in which the drain electrode DE of the first transistor T1 is exposed, and a second via hole VH2 in which the driving voltage line DVL is exposed.

The first and second partition walls PW1 and PW2 may be disposed on the passivation layer PSV at positions spaced apart from each other by a predetermined distance. As illustrated in FIG. 10, each of the first and second partition walls PW1 and PW2 may include a curved surface having a cross-sectional shape such as a semi-circle or a semi-ellipse, the width of which reduces from one surface of the passivation layer PSV toward an upper end of the cross-sectional shape, but the disclosure is not limited thereto. In an embodiment, as illustrated in FIG. 11, each of the first and second partition walls PW1 and PW2 may have a trapezoidal cross-section, the width of reduces from the one surface of the passivation layer PSV toward an upper end the trapezoidal cross-section.

In a sectional diagram, the shape of each of the first and second partition walls PW1 and PW2 is not limited to the foregoing examples, and may vary within a range in which the efficiency of light emitted from each of the light emitting elements LD can be enhanced.

The first and second partition walls PW1 and PW2 may be disposed on the same plane on the passivation layer PSV and may have the same height.

The first electrode REL1 and the second electrode REL2 may reflect light emitted from the opposite ends EP1 and EP2 of each of the light emitting elements LD to allow it to travel in a direction (e.g., in a frontal direction) in which an image of the display device is displayed.

The first electrode REL1 may be provided on the first partition wall PW1, and the second electrode REL2 may be provided on the second partition wall PW2. Each of the first electrode REL1 and the second electrode REL2 may have a shape corresponding to the shape of the corresponding partition wall.

The first electrode REL1 and the second electrode REL2 may function as alignment electrodes for aligning the light emitting elements LD in the unit emission area 100 of each of the first to third sub-pixels SP1 to SP3. To this end, a first alignment voltage may be applied to the first electrode REL1 through the first connection line CNL1, and a second alignment voltage may be applied to the second electrode REL2 through the second connection line CNL2.

If the alignment of the light emitting elements LD is completed, the supply of the first and second alignment voltages may be interrupted.

In an embodiment of the disclosure, the first electrode REL1 may be electrically connected to the drain electrode DE of the first transistor T1 through the first via hole VH1 of the passivation layer PSV. Hence, a signal supplied to the first transistor T1 may be transmitted to the first electrode REL1.

The second electrode REL2 may be electrically connected to the driving voltage line DVL through the second via hole VH2 of the passivation layer PSV. Consequently, the second driving power VSS of the driving voltage line DVL may be transmitted to the second electrode REL2.

The first electrode REL1 may include a 1-1-th electrode REL1_1 and a 1-2-th electrode REL1_2 with the second electrode REL2 interposed therebetween. The 1-1-th electrode REL1_1 and the 1-2-th electrode REL1_2 may diverge from the first connection line CNL1, which extends in a first direction DR1, in a second direction DR2 intersecting the first direction DR1.

The 1-1-th electrode REL1_1, the 1-2 th electrode REL1_2, and the first connection line CNL1 may be integrally provided on the passivation layer PSV of the pixel circuit layer PCL and may be electrically and/or physically connected to each other, but the disclosure is not limited thereto. For example, the 1-1-th and 1-2-th electrodes REL1_1 and REL1_2 and the first connection line CNL1 may be provided on different layers and may be electrically connected to each other through a separate contact unit (e.g., a contact hole and/or a contact electrode).

The second electrode REL2 may diverge from the second connection line CNL2 and may extend in the second direction DR2. The second electrode REL2 and the second connection line CNL2 may be integrally provided on the passivation layer PSV of the pixel circuit layer PCL and may be electrically and/or physically connected to each other, but the disclosure is not limited thereto. For example, the second electrode REL2 and the second connection line CNL2 may be provided on different layers and may be electrically connected to each other through a separate contact unit.

The first connection line CNL1 provided in the first sub-pixel SP1 may be electrically separated from the first connection line CNL1 provided in the second sub-pixel SP2 disposed adjacent to the first sub-pixel SP1. The first connection line CNL1 provided in the second sub-pixel SP2 may be electrically separated from a first connection line CNL1 provided in the third sub-pixel SP3 disposed adjacent to the second sub-pixel SP2.

Hence, the first connection line CNL1 provided in one sub-pixel may be electrically separated from the first connection line CNL1 provided in a sub-pixel disposed adjacent to the one sub-pixel. Thus, each of the first to third sub-pixels SP1 to SP3 may be individually driven.

The second connection line CNL2 provided in the first sub-pixel SP1 may be provided in common in the second and third sub-pixels SP2 and SP3 disposed adjacent to the first sub-pixel SP1. In other words, the first to third sub-pixels SP1, SP2, and SP3 may be electrically connected in common to the second connection line CNL2.

A first insulating layer INS1 may be provided on the first and second electrodes REL1 and REL2. The first insulating layer INS1 may include a first contact hole CH1 in which a portion of the first electrode REL1 is exposed, and a second contact hole CH2 in which a portion of the second electrode REL2 is exposed.

The light emitting elements LD may be aligned on the first insulating layer INS1 between the first electrode REL1 and the second electrode REL2. Each of the light emitting elements LD may include first and second ends EP1 and EP2 in the longitudinal direction.

Each of the light emitting elements LD may include a first conductive semiconductor layer 11, an active layer 12, a second conductive semiconductor layer 13, and an electrode layer 15, which are sequentially stacked in the longitudinal direction. Each of the light emitting elements LD may further include an insulating film 14 that encloses an outer circumferential surface of each of the first and second conductive semiconductor layers 11 and 13 and the active layer 12.

A second insulating layer INS2 may be provided on the first and second electrodes REL1 and REL2. The second insulating layer INS2 may include a first contact hole CH1 in which a portion of the first electrode REL1 is exposed, and a second contact hole CH2 in which a portion of the second electrode REL2 is exposed.

The second insulating layer INS2 may also be provided on a portion of the upper surface of each of the light emitting elements LD. Hence, the opposite ends EP1 and EP2 of each of the light emitting elements LD may be exposed to the outside. For the sake of convenience, the second insulating layer INS2 formed on a portion of the upper surface of each of the light emitting elements LD will be referred to as an insulating pattern INSP.

The first contact electrode CNE1 may be provided on the first electrode REL1 to electrically and/or physically connect the first electrode REL1 with any one end of the opposite ends EP1 and EP2 of each of the light emitting elements LD. The first contact electrode CNE1 may be electrically connected to the first electrode REL1 through the first contact hole CH1 of the first and second insulating layers INS1 and INS2.

The first electrode REL1 may be electrically connected to the one end of each of the light emitting elements LD through the first contact electrode CNE1. Hence, the signal of the transistor that is transmitted to the first electrode REL1 may be transmitted to the one end of each of the light emitting elements LD.

The second contact electrode CNE2 may be provided on the second electrode REL2 to electrically and/or physically connect the second electrode REL2 with any one end of the opposite ends EP1 and EP2 of each of the light emitting elements LD. The second contact electrode CNE2 may be electrically connected to the second electrode REL2 through the second contact hole CH2 of the first and second insulating layers INS1 and INS2.

The second electrode REL2 may be electrically connected to the other end of each of the light emitting elements LD through the second contact electrode CNE2. Hence, the second driving power VSS transmitted to the second electrode REL2 may be transmitted to the other end of each of the light emitting elements LD.

The first contact electrode CNE1 and the second contact electrode CNE2 may be provided on the same plane, and may be disposed on the insulating pattern INSP at positions spaced apart from each other by a predetermined distance d so that the first and second contact electrodes CNE1 and CNE2 can be electrically separated from each other. In an embodiment of the disclosure, the first contact electrode CNE1 may overlap a first side of the insulating pattern INSP, and the second contact electrode CNE2 may overlap a second side of the insulating pattern INSP. Hence, a portion of the upper surface of the insulating pattern INSP may be exposed to the outside.

Passivation patterns PSP formed of inorganic material may be respectively provided on the first contact electrode CNE1 and the second contact electrode CNE2.

The passivation patterns PSP may respectively prevent the first and second contact electrodes CNE1 and CNE2 from being exposed to the outside, thus preventing the first and second contact electrodes CNE1 and CNE2 from corroding. The passivation patterns PSP may respectively prevent the first and second contact electrodes CNE1 and CNE2 from undesirably short-circuiting because of defects or the like caused during a process of forming the first and second contact electrodes CNE1 and CNE2.

In a plan view, the passivation pattern PSP may overlap each of the first and second contact electrodes CNE1 and CNE2. The passivation pattern (hereinafter, referred to as 'first passivation pattern') PSP that overlaps the first contact electrode CNE1 and the passivation pattern (hereinafter, referred to as 'second passivation pattern') PSP that overlaps the second contact electrode CNE2 may be spaced apart from each other by a predetermined distance. A distance between the first passivation pattern PSP and the second passivation pattern PSP may be equal to or greater than a distance d between the first contact electrode CNE1 and the second contact electrode CNE2.

A third insulating layer INS3 may be provided on the exposed portion of the upper surface of the insulating pattern INSP, the first passivation pattern PSP, and the second passivation pattern PSP. An overcoat layer OC may be provided on the third insulating layer INS3.

As described above, if predetermined voltages are applied to the opposite ends EP1 and EP2 of each of the light emitting elements LD, each of the light emitting elements LD may emit light by coupling of electron-hole pairs in the active layer 12 of the light emitting element LD. Light emitted from the opposite ends EP1 and EP2 of each of the light emitting elements LD may be moved to the first electrode REL1 and the second electrode REL2 and then may be reflected in the frontal direction. Hence, the display device may display an image corresponding to the light.

As described above, in the display device in accordance with an embodiment of the disclosure, the first and second contact electrodes CNE1 and CNE2 may be formed through a single process, so that the fabricating process may be simplified.

In the display device in accordance with an embodiment of the disclosure, the passivation pattern PSP may be provided on each of the first and second contact electrodes CNE1 and CNE2, so that defects which are caused during a process of forming the first and second contact electrodes CNE1 and CNE2 may be minimized.

The display device in accordance with an embodiment of the disclosure may be employed in various electronic devices. For instance, the display device may be applied to a television, a notebook computer, a cellular phone, a smartphone, a smartpad, a portable multimedia player (PMP), a personal digital assistant (PDA), a navigation device, various kinds of wearable devices such as a smartwatch, etc.

While various embodiments have been described above, those skilled in the art will appreciate that various modifications, additions and substitutions are possible, without departing from the scope and spirit of the disclosure.

Therefore, the embodiments disclosed in this specification are only for illustrative purposes rather than limiting the technical spirit of the disclosure. The scope of the claimed invention shall be defined by the accompanying claims.

What is claimed is:

1. A light emitting device comprising:
    a substrate including emission areas;
    a first electrode disposed on the substrate;
    a second electrode spaced apart from the first electrode, the first electrode and the second electrode being disposed on a same layer;
    at least one light emitting element disposed on the substrate, and including a first end and a second end with respect to a longitudinal direction of the at least one light emitting element;
    an insulating layer disposed on the at least one light emitting element and allowing the first end and the second end of the at least one light emitting element to be exposed;
    a first contact electrode that electrically connects the first electrode with the first end of the at least one light emitting element;
    a second contact electrode spaced apart from the first contact electrode, and electrically connecting the second electrode with the second end of the at least one light emitting element, the first contact electrode and the second contact electrode being disposed on a same layer; and
    a passivation pattern disposed directly on each of the first contact electrode and the second contact electrode,
    wherein the first contact electrode and the second contact electrode are disposed on the insulating layer, spaced apart from each other, and electrically separated from each other.

2. The light emitting device according to claim 1, wherein the passivation pattern each includes an inorganic insulating layer formed of inorganic material.

3. The light emitting device of claim 2, wherein
    the passivation pattern is comprised of silicon nitride,
    the first contact electrode and the second contact electrode are comprised of a transparent conductive material, and an adhesive force between the passivation pattern and each of the first contact electrode and the second contact electrode is enhanced so that an etchant cannot penetrate an interface between the passivation pattern and each of the first contact electrode and the second contact electrode.

4. The light emitting device according to claim 2, wherein a distance between the first contact electrode and the second contact electrode is less than a length of the at least one light emitting element.

5. The light emitting device according to claim 4, wherein the passivation pattern disposed on the first contact electrode and the passivation pattern disposed on the second contact electrode are spaced apart from each other by a distance equal to the distance between the first contact electrode and the second contact electrode.

6. The light emitting device according to claim 4, wherein the insulating layer includes a first contact hole in which a portion of the first electrode is exposed, and a second contact hole in which a portion of the second electrode is exposed.

7. The light emitting device according to claim 6, wherein the first contact electrode is electrically connected to the first electrode through the first contact hole, and the second contact electrode is electrically connected to the second electrode through the second contact hole.

8. The light emitting device according to claim 7, comprising:
   a first bank disposed between the substrate and the first electrode; and
   a second bank spaced apart from the first bank by a predetermined distance, and disposed between the substrate and the second electrode, the first bank and the second bank being disposed on a same layer.

9. The light emitting device according to claim 1, wherein the at least one light emitting element comprises:
   a first semiconductor layer doped with a first conductive dopant;
   a second semiconductor layer doped with a second conductive dopant; and
   an active layer disposed between the first semiconductor layer and the second semiconductor layer.

10. The light emitting device according to claim 9, wherein the at least one light emitting element includes a light emitting diode having a shape of a cylinder or poly-prism and having a micro-scale or nano-scale size.

11. The light emitting device of claim 1, wherein the insulating layer is further disposed on the first electrode and on the second electrode.

12. The light emitting device of claim 1, wherein
   the insulating layer is disposed on an upper surface of the light emitting element which faces away from the substrate, and
   the insulating layer is absent from a lower and opposite surface of the light emitting element that faces the substrate.

13. A method of fabricating a light emitting device, comprising:
   forming a first electrode and a second electrode on a substrate including emission areas, the first electrode and the second electrode being spaced apart from each other;
   forming a first insulating material layer on the substrate including the first and the second electrodes;
   aligning at least one light emitting element on the first insulating material layer between the first electrode and the second electrode by forming an electric field between the first electrode and the second electrode;
   forming a second insulating material layer on the first insulating material layer including the at least one light emitting element;
   forming, by removing portions of the first and second insulating material layers, a first insulating layer and an insulating material pattern disposed on the first insulating layer;
   forming a first contact hole exposing a portion of the first electrode and a second contact hole exposing a portion of the second electrode;
   forming, by removing a portion of the insulating material pattern, a second insulating layer allowing opposite ends of the at least one light emitting element to be exposed;
   forming a conductive layer and a third insulating material layer on the second insulating layer;
   forming, by removing a portion of the third insulating material layer, a passivation pattern allowing a portion of the conductive layer to be exposed; and
   forming, by removing a portion of the conductive layer using the passivation pattern as a mask, a first contact electrode electrically connected to the first electrode, and a second contact electrode electrically connected to the second electrode.

14. The method according to claim 13, wherein the passivation pattern includes an inorganic insulating layer formed of inorganic material.

15. The method according to claim 14, wherein the forming of the passivation pattern comprises:
   forming a photoresist layer on the third insulating material layer;
   forming a photoresist pattern including an opening corresponding to an area of the second insulating layer using a mask; and
   removing a portion of the third insulating material layer that corresponds to the opening using the photoresist pattern as a mask.

16. The method according to claim 15, wherein the forming of the first contact electrode and the second contact electrode includes forming the first contact electrode and the second contact electrode on a same layer electrically separated from each other.

17. The method according to claim 16, wherein the forming of the first contact electrode and the second contact electrode includes forming the first and second contact electrodes to be spaced apart from each other by a distance less than a length of the at least one light emitting element.

18. The method according to claim 17, comprising:
   forming a first bank between the substrate and the first electrode; and
   forming a second bank between the substrate and the second electrode.

19. A display device comprising:
   a substrate including a display area and a non-display area; and
   a plurality of pixels disposed in the display area, and including at least one sub-pixel,
   wherein the at least one sub-pixel comprises a pixel circuit layer including at least one transistor, and a display element layer including an emission area through which light is emitted,
   wherein the display element layer comprises:
   a first electrode disposed on the pixel circuit layer;
   a second electrode spaced apart from the first electrode, the first electrode and the second electrode being disposed on a same layer;

at least one light emitting element disposed on the pixel circuit layer, and including a first end and a second end with respect to a longitudinal direction of the at least one light emitting element;

an insulating layer disposed on the at least one light emitting element and allowing the first end and the second end of the at least one light emitting element to be exposed;

a first contact electrode that electrically connects the first electrode with the first end of the at least one light emitting element;

a second contact electrode spaced apart from the first contact electrode, and electrically connecting the second electrode with the second end of the at least one light-emitting element, the first contact electrode and the second contact electrode being disposed on a same layer; and a passivation pattern disposed on each of the first contact electrode and the second contact electrode, and wherein the first contact electrode and the second contact electrode are disposed on the insulating layer, spaced apart from each other, and electrically separated from each other, and the passivation pattern includes an inorganic insulating layer formed of inorganic material.

20. The display device according to claim 19, wherein a distance between the first contact electrode and the second contact electrode is less than a length of the light emitting element.

21. The display device according to claim 20, wherein the passivation pattern disposed on the first contact electrode and the passivation pattern disposed on the second contact electrode are spaced apart from each other by a distance equal to the distance between the first contact electrode and the second contact electrode.

22. The display device according to claim 21, wherein the insulating layer includes:
- a first contact hole in which a portion of the first electrode is exposed; and
- a second contact hole in which a portion of the second electrode is exposed, and the first contact electrode is electrically connected to the first electrode through the first contact hole, and the second contact electrode is electrically connected to the second electrode through the second contact hole.

* * * * *